(12) United States Patent
Shim et al.

(10) Patent No.: US 9,177,898 B2
(45) Date of Patent: Nov. 3, 2015

(54) INTEGRATED CIRCUIT PACKAGE SYSTEM WITH LOCKING TERMINAL

(75) Inventors: Il Kwon Shim, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 191 days.

(21) Appl. No.: 12/146,192

(22) Filed: Jun. 25, 2008

(65) Prior Publication Data
US 2009/0321913 A1 Dec. 31, 2009

(51) Int. Cl.
*H01L 23/495* (2006.01)
*H01L 21/48* (2006.01)
*H01L 21/56* (2006.01)
*H01L 23/31* (2006.01)
*H01L 23/498* (2006.01)
*H01L 23/00* (2006.01)
*H01L 25/03* (2006.01)
*H01L 25/065* (2006.01)
*H01L 23/50* (2006.01)

(52) U.S. Cl.
CPC ...... *H01L 23/49541* (2013.01); *H01L 21/4821* (2013.01); *H01L 21/568* (2013.01); *H01L 23/3107* (2013.01); *H01L 23/49503* (2013.01); *H01L 23/49548* (2013.01); *H01L 23/49816* (2013.01); *H01L 24/49* (2013.01); *H01L 25/03* (2013.01); *H01L 25/0657* (2013.01); *H01L 23/50* (2013.01); *H01L 24/48* (2013.01); *H01L 2224/32245* (2013.01); *H01L 2224/48091* (2013.01); *H01L 2224/48247* (2013.01); *H01L 2224/48257* (2013.01); *H01L 2224/49109* (2013.01); *H01L 2224/73265* (2013.01); *H01L 2224/85001* (2013.01); *H01L 2225/0651* (2013.01); *H01L 2225/06517* (2013.01); *H01L 2924/014* (2013.01); *H01L 2924/0105* (2013.01); *H01L 2924/01027* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/19105* (2013.01); *H01L 2924/19106* (2013.01)

(58) Field of Classification Search
CPC ..................................... H01L 23/48
USPC .......................................... 257/676
See application file for complete search history.

(56) References Cited

U.S. PATENT DOCUMENTS

| | | | |
|---|---|---|---|
| 6,072,239 A | 6/2000 | Yoneda et al. | |
| 6,191,494 B1 | 2/2001 | Ooyama et al. | |
| 6,329,711 B1 | 12/2001 | Kawahara et al. | |
| 6,339,261 B1 * | 1/2002 | Yonemochi et al. | 257/784 |
| 6,348,416 B1 | 2/2002 | Toya et al. | |
| 6,498,099 B1 | 12/2002 | McLellan et al. | |
| 6,528,877 B2 | 3/2003 | Ernst et al. | |
| 6,607,937 B1 * | 8/2003 | Corisis | 438/108 |
| 6,635,957 B2 | 10/2003 | Kwan et al. | |
| 6,770,959 B2 | 8/2004 | Huang et al. | |
| 6,774,449 B1 | 8/2004 | Nishii et al. | |

(Continued)

Primary Examiner — Ajay K Arora
(74) Attorney, Agent, or Firm — Ishimaru & Associates LLP

(57) ABSTRACT

An integrated circuit package system includes: forming a first locking terminal having a first terminal recess with a top portion of the first terminal recess narrower than a bottom portion of the first terminal recess; connecting an integrated circuit and the first locking terminal; and forming a package encapsulation over the integrated circuit and in the first locking terminal.

20 Claims, 15 Drawing Sheets

(56) References Cited

U.S. PATENT DOCUMENTS

| | | |
|---|---|---|
| 7,049,177 B1 | 5/2006 | Fan et al. |
| 2004/0124505 A1* | 7/2004 | Mahle et al. ................. 257/666 |
| 2005/0263864 A1* | 12/2005 | Islam et al. ................... 257/676 |
| 2007/0187826 A1 | 8/2007 | Shim et al. |
| 2007/0257348 A1 | 11/2007 | Yang |

* cited by examiner

INTEGRATED CIRCUIT PACKAGE SYSTEM WITH LOCKING TERMINAL

TECHNICAL FIELD

The present invention relates generally to an integrated circuit package system and more particularly to an integrated circuit package system having a locking terminal.

BACKGROUND ART

Modern consumer electronics, such as smart phones, personal digital assistants, and location based services devices, as well as enterprise electronics, such as servers and storage arrays, are packing more integrated circuits into an ever-shrinking physical space with expectations for decreasing cost. Every new generation of integrated circuits with increased operating frequency, performance and the higher level of large-scale integration have underscored the need for back-end integrated circuit manufacturing to provide more solutions involving the integrated circuit itself. Numerous technologies have been developed to meet these requirements. Some of the research and development strategies focus on new package technologies while others focus on improving the existing and mature package technologies.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact locking terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with thinner and thinner profile in high volume. Despite the trend towards miniaturization and thinner profile, more functions and more integrated circuits continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a first locking terminal having a first terminal recess with a top portion of the first terminal recess narrower than a bottom portion of the first terminal recess; connecting an integrated circuit and the first locking terminal; and forming a package encapsulation over the integrated circuit and in the first locking terminal.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
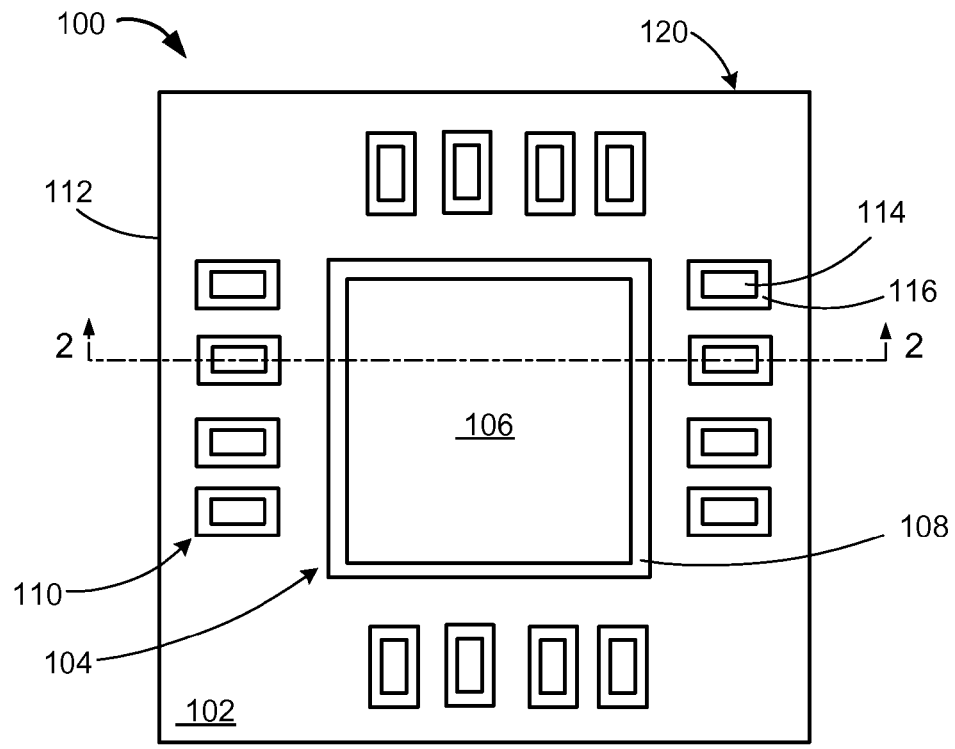
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts a package encapsulation 102, such as a cover of an epoxy molding compound. A locking paddle 104, such as a die-attach paddle, can be at the central location of the integrated circuit package system 100. The locking paddle 104 can include a paddle base 106 and a paddle rim 108 around the paddle base 106. Locking terminals 110, such as plated locking terminals, can be between sides 112 of the integrated circuit package system 100 and the locking paddle 104. Each of the locking terminals 110 can include a terminal base 114 and a terminal rim 116 around the terminal base 114. A package perimeter 120 of a package encapsulation 102 completely surrounds the locking terminal 110 and the locking paddle 104.

For illustrative purposes, the integrated circuit package system 100 is shown with one row of the locking terminals 110, although it is understood that the integrated circuit package system 100 can include a different number of rows. For example, the integrated circuit package system 100 can have more than one row of the locking terminals 110 or different number of rows of the locking terminals 110 along the sides 112 of the integrated circuit package system 100. As another example, the integrated circuit package system 100 may not have the locking terminals 110 along all the sides 112, such as along one of the sides 112 or along two of the sides 112. As a further example, the locking terminals 110 can be arranged in multiple rows in a configuration of uniformed or non-uniform distributed array, or staggered or non-staggered configuration.

Further for illustrative purposes, the integrated circuit package system 100 includes the locking terminals 110 in a rectangular geometric configuration, although it is understood that the integrated circuit package system 100 can have the locking terminals 110 with different geometric configurations. For example, the locking terminals 110 can have a circular geometric configuration.

Figure 2:
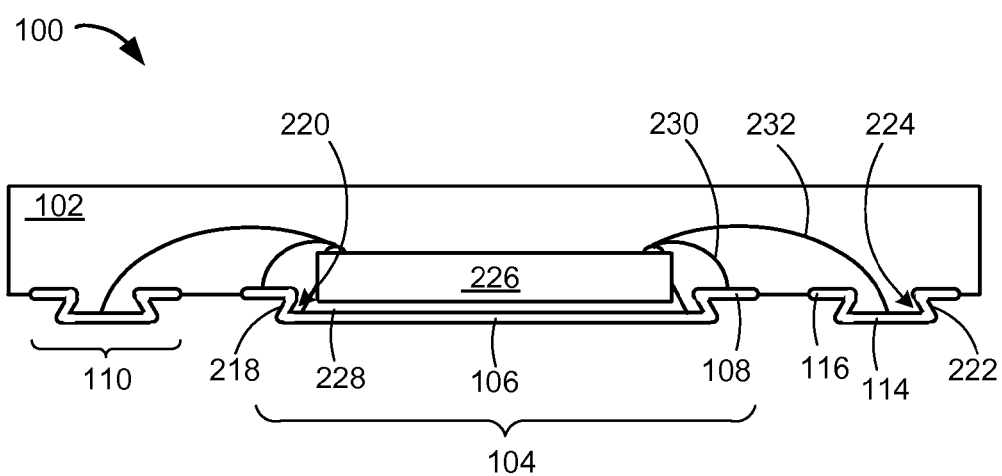
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the locking paddle 104 including the paddle base 106, the paddle rim 108, and a paddle wall 218 between the paddle base 106 and the paddle rim 108. The locking paddle 104 includes a paddle recess 220 with a bottom portion of the paddle recess 220 is wider than a top portion of the paddle recess 220 such that the paddle wall 218 has a non-vertical angle. The locking paddle 104 is shown having a Z-shaped configuration from the paddle rim 108 to the paddle base 106.

Each of the locking terminals 110 includes the terminal base 114, the terminal rim 116, and a terminal wall 222 between the terminal base 114 and the terminal rim 116. Each of the locking terminals 110 includes a terminal recess 224 with a bottom portion of the terminal recess 224 is wider than a top portion of the terminal recess 224 such that the terminal wall 222 has a non-vertical angle. The terminal recess 224 is the space defined by the terminal base 114 and the terminal wall 222, which is slanted inward such that a top opening of the terminal recess 224 is narrower than the bottom of the terminal recess 224. The locking terminals 110 are shown having a Z-shaped configuration from the terminal rim 116 to the terminal base 114.

The locking paddle 104 and the locking terminals 110 can be formed of a single material and layer or can be formed with multiple layers. For example, the locking paddle 104 and the locking terminals 110 can be formed with gold (Au), palladium (Pd), nickel (Ni), silver (Ag), tin (Sn), an alloy, or any combination thereof.

An integrated circuit 226, such as an integrated circuit die, can be over the locking paddle 104 within the paddle recess 220. A first adhesive 228, such as a die-attach adhesive, can attach the integrated circuit 226 and the paddle base 106. The locking terminals 110 adjacent to the locking paddle 104 can be toward the periphery of the integrated circuit package system 100.

First interconnects 230, such as bond wires or ribbon bond wires, can connect the integrated circuit 226 and the paddle rim 108. Second interconnects 232, such as bond wires or ribbon bond wires, can connect the integrated circuit 226 and the terminal base 114 in the terminal recess 224.

For illustrative purposes, the integrated circuit package system 100 includes the second interconnects 232 connecting the integrated circuit 226 and the terminal base 114, although it is understood that the integrated circuit package system 100 can have the second interconnects 232 connecting the integrated circuit 226 and the terminal rim 116. Also for illustrative purposes, the integrated circuit package system 100 is shown with the first interconnects 230 and the second interconnects 232 connecting to the same connection of the integrated circuit 226, although it is understood that the integrated circuit package system 100 can have different connections. For example, the first interconnects 230 and the second interconnects 232 can connect to different portions of the integrated circuit 226.

Further for illustrative purposes, the integrated circuit package system 100 is shown with the first interconnects 230 and the second interconnects 232 for connecting the integrated circuit 226 with the locking paddle 104 and the locking terminals 110 respectively, although it is understood that the integrated circuit package system 100 can have a different configuration. For example, the integrated circuit package system 100 can use the first interconnects 230 without the second interconnects 232, or the second interconnects 232 without the first interconnects 230.

The package encapsulation 102 covers the integrated circuit 226, the first interconnects 230, and the second interconnects 232. The package encapsulation 102 fills the terminal recess 224 and the paddle recess 220. The locking terminals 110 having the Z-shaped structure function as a mold interlock securing the locking terminals 110 with the package encapsulation 102. The mold interlock feature of the locking terminals 110 improves performance in moisture sensitivity level (MSL) tests and improves reliability of the integrated circuit package system 100. The locking paddle 104 having the Z-shaped structure also functions as a mold interlock securing the locking paddle 104 with the package encapsulation 102. The mold interlock feature of the locking paddle 104 also improves performance in moisture sensitivity level (MSL) tests and improves reliability of the integrated circuit package system 100.

The locking paddle 104 and the locking terminals 110 are partially exposed by the package encapsulation 102. The paddle rim 108 and the terminal rim 116 can be co-planar with the package encapsulation 102. The paddle base 106 and the paddle wall 218 extend below the package encapsulation 102. terminal base 114 and the terminal wall 222 extend below the package encapsulation 102.

The terminal rim 116 extends outward completely around the terminals wall 222. The bottom side of the terminal base 114 is co-planar with the bottom side of the terminal base 114 of another of the locking terminals 110.

It has been discovered that the present invention provides an integrated circuit package system having thin profile with improved reliability with the mold interlocking features of the locking paddle and the locking terminals. The lead locking feature at bump terminals prevent the leads detachment from the package encapsulation. The wider paddle base and terminal base improve solder joint reliability with larger solder interface area at bump terminals to withstand thermally induced stress.

Figure 3:
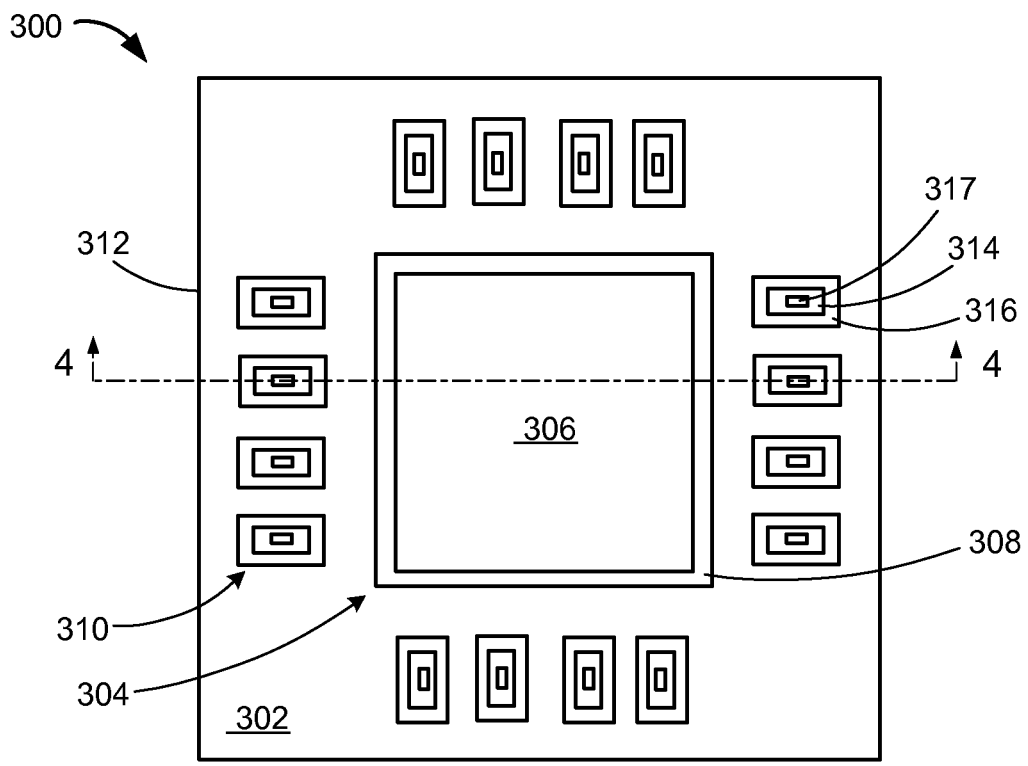
FIG. 3 is a bottom view of an integrated circuit package system in a second embodiment of the present invention.

Referring now to FIG. 3, therein is a bottom view of an integrated circuit package system 300 in a second embodiment of the present invention. The integrated circuit package system 300 includes structural similarities to the integrated circuit package system 100 of FIG. 1. The bottom view depicts a package encapsulation 302, such as a cover of an epoxy molding compound. A locking paddle 304, such as a die-attach paddle, can be at the central location of the integrated circuit package system 300. The locking paddle 304 can include a paddle base 306 and a paddle rim 308. Locking terminals 310, such as plated locking terminals, can be between sides 312 of the integrated circuit package system 300 and the locking paddle 304. Each of the locking terminals 310 can include a terminal base 314, an outer terminal rim 316 around the terminal base 314, and an inner terminal rim 317 surrounded by the terminal base 314.

For illustrative purposes, the integrated circuit package system 300 is shown with one row of the locking terminals 310, although it is understood that the integrated circuit package system 300 can include a different number of rows. For example, the integrated circuit package system 300 can have more than one row of the locking terminals 310 or different number of rows of the locking terminals 310 along the sides 312 of the integrated circuit package system 300. As another example, the integrated circuit package system 300 may not have the locking terminals 310 along all the sides 312, such as along one of the sides 312 or along two of the sides 312. As a further example, the locking terminals 310 can be arranged in multiple rows in a configuration of uniformed or non-uniform distributed array, or staggered or non-staggered configuration.

Further for illustrative purposes, the integrated circuit package system 300 includes the locking terminals 310 in a rectangular geometric configuration, although it is understood that the integrated circuit package system 300 can have the locking terminals 310 with different geometric configurations. For example, the locking terminals 310 can have a circular geometric configuration.

Figure 4:
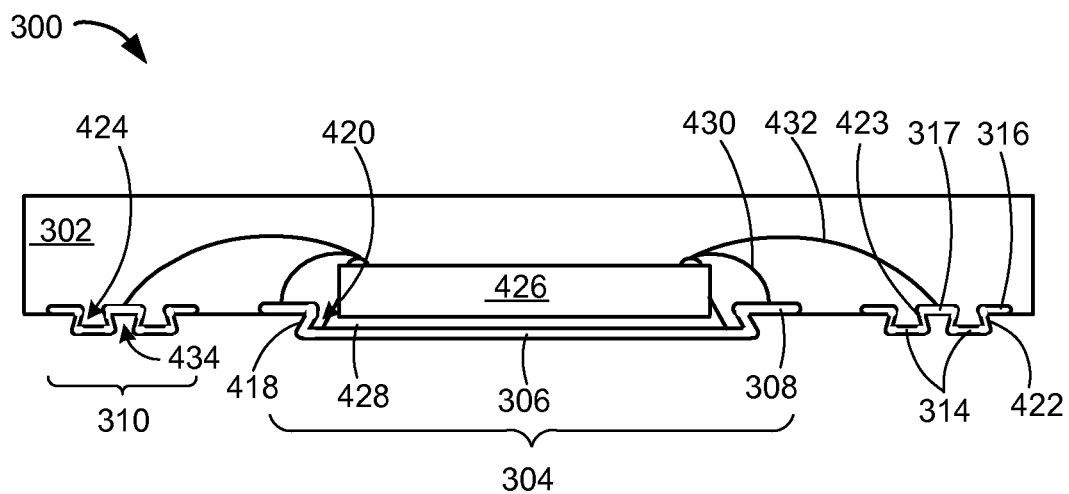
FIG. 4 is a cross-sectional view of the integrated circuit package system along line 4-4 of FIG. 3.

Referring now to FIG. 4, therein is a cross-sectional view of the integrated circuit package system 300 along line 4-4 of FIG. 3. The cross-sectional view depicts the locking paddle 304 including the paddle base 306, the paddle rim 308, and a paddle wall 418 between the paddle base 306 and the paddle rim 308. The locking paddle 304 includes a paddle recess 420 with a bottom portion of the paddle recess 420 is wider than a top portion of the paddle recess 420 such that the paddle wall 418 has a non-vertical angle. The locking paddle 304 is shown having a Z-shaped configuration from the paddle rim 308 to the paddle base 306.

Each of the locking terminals 310 includes the terminal base 314, the outer terminal rim 316, the inner terminal rim 317, an outer terminal wall 422, and an inner terminal wall 423. The outer terminal wall 422 is between the terminal base 314 and the outer terminal rim 316. The inner terminal wall 423 is between the terminal base 314 and the inner terminal rim 317. A terminal cavity 434 is bounded by the inner terminal wall 423 and the inner terminal rim 317.

Each of the locking terminals 310 includes a terminal recess 424 bounded by the terminal base 314, the outer terminal wall 422, and the inner terminal wall 423. The locking terminals 310 include a bottom portion of the terminal recess 424 that is wider than a top portion of the terminal recess 424 such that the outer terminal wall 422 and the inner terminal wall 423 have non-vertical angles. The locking terminals 310 are shown having a Z-shaped configuration from the inner terminal rim 317 to the terminal base 314 and from the outer terminal rim 316 to the terminal base 314.

The locking paddle 304 and the locking terminals 310 can be formed of a single material and layer or can be formed with multiple layers. For example, the locking paddle 304 and the locking terminals 310 can be formed with gold (Au), palladium (Pd), nickel (Ni), silver (Ag), tin (Sn), an alloy, or any combination thereof.

An integrated circuit 426, such as an integrated circuit die, can be over the locking paddle 304 within the paddle recess 420. A first adhesive 428, such as a die-attach adhesive, can attach the integrated circuit 426 and the paddle base 306. The locking terminals 310 adjacent to the locking paddle 304 can be toward the periphery of the integrated circuit package system 300.

First interconnects 430, such as bond wires or ribbon bond wires, can connect the integrated circuit 426 and the paddle rim 308. Second interconnects 432, such as bond wires or ribbon bond wires, can connect the integrated circuit 426 and the inner terminal rim 317.

For illustrative purposes, the integrated circuit package system 300 includes the second interconnects 432 connecting the integrated circuit 426 and the inner terminal rim 317, although it is understood that the integrated circuit package system 300 can have the second interconnects 432 connecting the integrated circuit 426 and the locking terminals 310 at a different location. For example, the second interconnects 432 can connect the integrated circuit 426 with the outer terminal rim 316 or with the terminal base 314.

Also for illustrative purposes, the integrated circuit package system 300 is shown with the first interconnects 430 and the second interconnects 432 connecting to the same connection of the integrated circuit 426, although it is understood that the integrated circuit package system 300 can have different connections. For example, the first interconnects 430 and the second interconnects 432 can connect to different portions of the integrated circuit 426.

Further for illustrative purposes, the integrated circuit package system 300 is shown with the first interconnects 430 and the second interconnects 432 for connecting the integrated circuit 426 with the locking paddle 304 and the locking terminals 310 respectively, although it is understood that the integrated circuit package system 300 can have a different configuration. For example, the integrated circuit package system 300 can use the first interconnects 430 without the second interconnects 432, or the second interconnects 432 without the first interconnects 430.

The package encapsulation 302 covers the integrated circuit 426, the first interconnects 430, and the second interconnects 432. The package encapsulation 302 fills the terminal recess 424 and the paddle recess 420. The locking terminals 310 having the Z-shaped structures function as a mold interlock securing the locking terminals 310 with the package encapsulation 302. The mold interlock feature of the locking terminals 310 improves performance in moisture sensitivity level (MSL) tests and improves reliability of the integrated circuit package system 300. The locking paddle 304 having the Z-shaped structure also functions as a mold interlock securing the locking paddle 304 with the package encapsulation 302. The mold interlock feature of the locking paddle 304 also improves performance in moisture sensitivity level (MSL) tests and improves reliability of the integrated circuit package system 300.

The locking paddle 304 and the locking terminals 310 are partially exposed by the package encapsulation 302. The paddle rim 308, the outer terminal rim 316, and the inner terminal rim 317 can be co-planar with the package encapsulation 302. The paddle base 306 and the paddle wall 418 extend below the package encapsulation 302. The terminal base 314, the outer terminal wall 422, and the inner terminal wall 423 extend below the package encapsulation 302.

It has been discovered that the present invention provides an integrated circuit package system having thin profile with improved reliability with the mold interlocking features of the locking terminals. The terminal cavity creates a ring of mold interlocking feature with the locking terminals thereby distributing molding interlocking stress of the package encapsulation.

Figure 5:
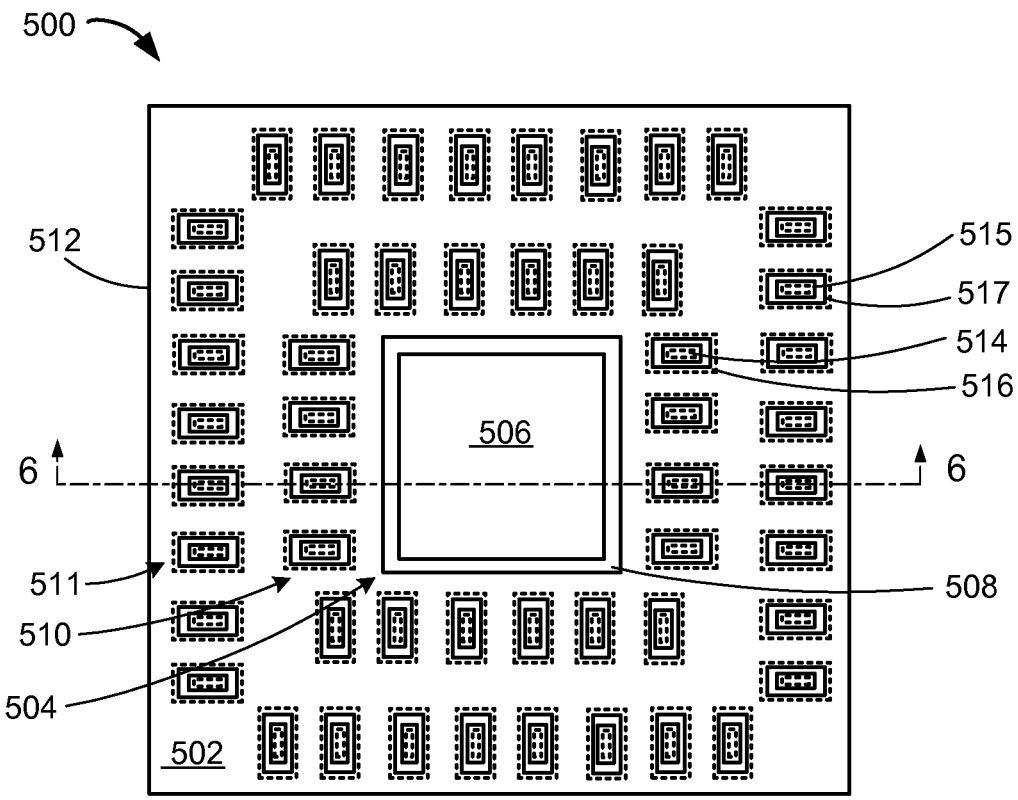
FIG. 5 is a bottom view of an integrated circuit package system in a third embodiment of the present invention.

Referring now to FIG. 5, therein is shown a bottom view of an integrated circuit package system 500 in a third embodiment of the present invention. The integrated circuit package system 500 includes structural similarities to the integrated circuit package system 100 of FIG. 1. The bottom view depicts a package encapsulation 502, such as a cover of an epoxy molding compound. A locking paddle 504, such as a die-attach paddle, can be at the central location of the integrated circuit package system 500. The locking paddle 504 can include a paddle base 506 and a paddle rim 508 around the paddle base 506.

First locking terminals 510, such as plated locking terminals, can be adjacent to the locking paddle 504. Second locking terminals 511, such as plated locking terminals, can be between sides 512 of the integrated circuit package system 500 and the first locking terminals 510. Each of the first locking terminals 510 can include a first terminal base 514 and a first terminal rim 516 around the first terminal base 514. Each of the second locking terminals 511 can include a second terminal base 515 and a second terminal rim 517 around the second terminal base 515.

For illustrative purposes, the integrated circuit package system 500 includes the first locking terminals 510 and the second locking terminals 511 in a rectangular geometric configuration, although it is understood that the integrated circuit package system 500 can have the first locking terminals 510 and the second locking terminals 511 with different geometric configurations. For example, the first locking terminals 510 and the second locking terminals 511 can have a circular geometric configuration. Also for example, the first locking terminals 510 and the second locking terminals 511 can have different geometric configurations from each other.

Figure 6:
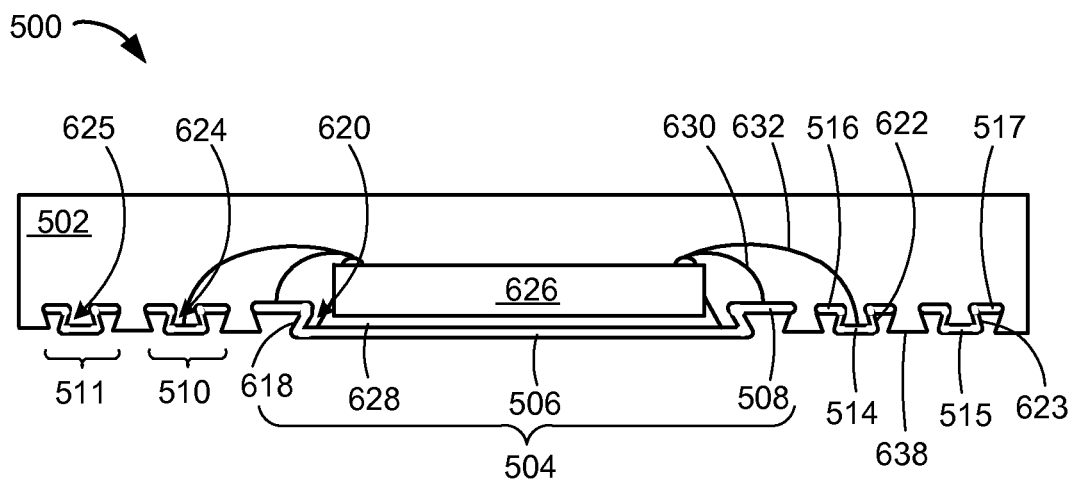
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The cross-sectional view depicts the locking paddle 504 including the paddle base 506, the paddle rim 508, and a paddle wall 618 between the paddle base 506 and the paddle rim 508. The locking paddle 504 includes a paddle recess 620 with a bottom portion of the paddle recess 620 is wider than a top portion of the paddle recess 620 such that the paddle wall 618 has a non-vertical angle. The locking paddle 504 is shown having a Z-shaped configuration from the paddle rim 508 to the paddle base 506.

Each of the first locking terminals 510 include the first terminal base 514, the first terminal rim 516, and a first terminal wall 622 between the first terminal base 514 and the first terminal rim 516. Each of the first locking terminals 510 includes a first terminal recess 624 with a bottom portion of the first terminal recess 624 is wider than a top portion of the first terminal recess 624 such that the first terminal wall 622 has a non-vertical angle. The first locking terminals 510 are shown having a Z-shaped configuration from the first terminal rim 516 to the first terminal base 514. For example, the inner most dotted square for the first locking terminals 510 shown in FIG. 5 can depict the first terminal recess 624.

Each of the second locking terminals 511 include the second terminal base 515, the second terminal rim 517, and a second terminal wall 623 between the second terminal base 515 and the second terminal rim 517. Each of the second locking terminals 511 includes a second terminal recess 625 with a bottom portion of the second terminal recess 625 is wider than a top portion of the second terminal recess 625 such that the second terminal wall 623 has a non-vertical angle. The second locking terminals 511 are shown having a Z-shaped configuration from the second terminal rim 517 to the second terminal base 515. For example, the inner most dotted square for the second locking terminals 511 shown in FIG. 5 can depict the second terminal recess 625.

The locking paddle 504, the first locking terminals 510, and the second locking terminals 511 can be formed of a single material and layer or can be formed with multiple layers. For example, the locking paddle 504, the first locking terminals 510, and the second locking terminals 511 can be formed with gold (Au), palladium (Pd), nickel (Ni), silver (Ag), tin (Sn), an alloy, or any combination thereof.

An integrated circuit 626, such as an integrated circuit die, can be over the locking paddle 504 within the paddle recess 620. A first adhesive 628, such as a die-attach adhesive, can attach the integrated circuit 626 and the paddle base 506. The first locking terminals 510 can be adjacent to the locking paddle 504. The second locking terminals 511 can be toward the periphery of the integrated circuit package system 500.

First interconnects 630, such as bond wires or ribbon bond wires, can connect the integrated circuit 626 and the paddle rim 508. Second interconnects 632, such as bond wires or ribbon bond wires, can connect the integrated circuit 626 and the first terminal base 514 in the first terminal recess 624.

The package encapsulation 502 covers the integrated circuit 626, the first interconnects 630, and the second interconnects 632. The package encapsulation 502 fills the first terminal recess 624, the second terminal recess 625, and the paddle recess 620. The first locking terminals 510 having the Z-shaped structure function as a mold interlock securing the first locking terminals 510 with the package encapsulation 502. The second locking terminals 511 having the Z-shaped structure function as a mold interlock securing the first locking terminals 510 with the package encapsulation 502. The mold interlock feature of the first locking terminals 510 and the second locking terminals 511 improves performance in moisture sensitivity level (MSL) tests and improves reliability of the integrated circuit package system 500. The locking paddle 504 having the Z-shaped structure also functions as a mold interlock securing the locking paddle 504 with the package encapsulation 502. The mold interlock feature of the locking paddle 504 also improves performance in moisture sensitivity level (MSL) tests and improves reliability of the integrated circuit package system 500.

The locking paddle 504, the first locking terminals 510, and the second locking terminals 511 are partially exposed by the package encapsulation 502. The paddle rim 508, the first terminal rim 516, and the second terminal rim 517 can be co-planar with the package encapsulation 502. The paddle base 506 and the paddle wall 618 extend below the package encapsulation 502. The first terminal base 514 and the first terminal wall 622 extend below the package encapsulation

502. The second terminal base 515 and the second terminal wall 623 extend below the package encapsulation 502.

Encapsulation protrusions 638 of the package encapsulation 502 can be between the first locking terminals 510 and the second locking terminals 511. The encapsulation protrusions 638 can also be between the first locking terminals 510 and the locking paddle 504. The encapsulation protrusions 638 do not impede the locking paddle 504, the first locking terminals 510, and the second locking terminals 511 connection with the next system level, such as printed circuit board or another integrated circuit package system.

Figure 7:
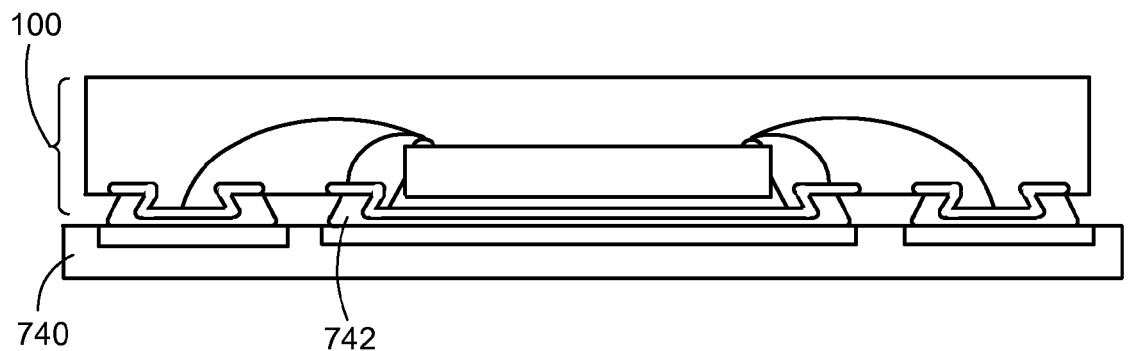
FIG. 7 is a cross-sectional view of an application of the integrated circuit package system of FIG. 2.

Referring now to FIG. 7, therein is shown a cross-sectional view of an application of the integrated circuit package system 100 of FIG. 2. The integrated circuit package system 100 is shown mounted over a subsystem carrier 740, such as a laminated substrate. An attachment structure 742, such as a solder joint, can connect and attach the integrated circuit package system 100 with the subsystem carrier 740

Figure 8:
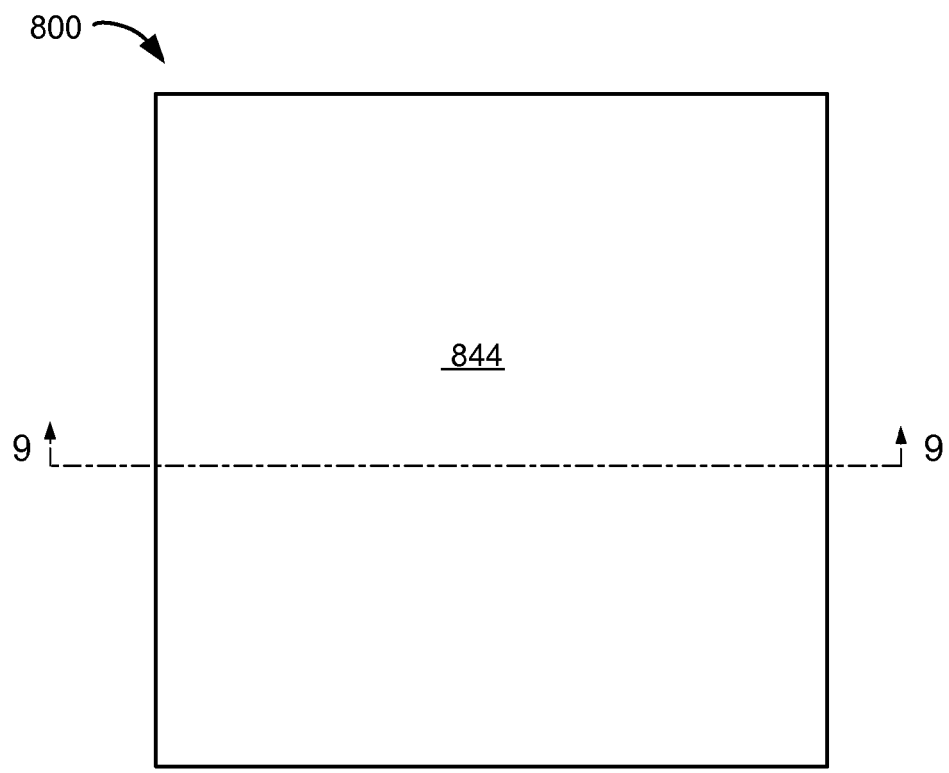
FIG. 8 is a top view of an integrated circuit package-in-package system in an application of the integrated circuit package system of FIG. 2 in a fourth embodiment of the present invention.

Referring now to FIG. 8, therein is shown a top view of an integrated circuit package-in-package system 800 in an application of the integrated circuit package system 100 of FIG. 2 in a fourth embodiment of the present invention. The top view depicts an outer encapsulation 844, such as a cover of an epoxy molding compound.

Figure 9:
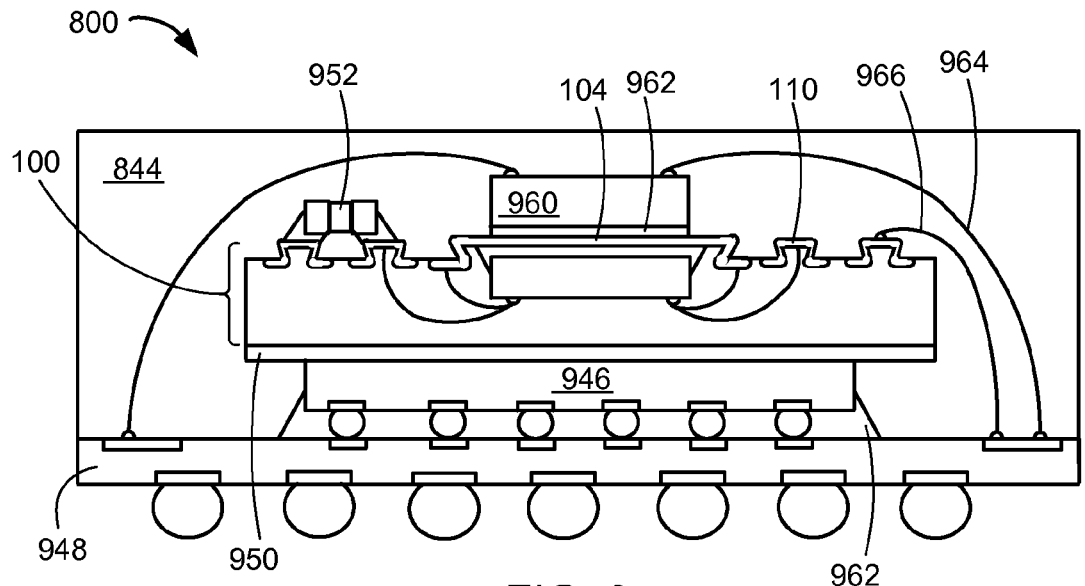
FIG. 9 is a cross-sectional view of the integrated circuit package package-in-package system along line 9-9 of FIG. 8.

Referring now to FIG. 9, therein is shown a cross-sectional view of the integrated circuit package-in-package system 800 along line 9-9 of FIG. 8. The cross-sectional view depicts a first device 946, such as a flip chip, mounted over a package carrier 948, such as a laminated substrate. The integrated circuit package system 300 can be mounted over the first device 946 with a stacking adhesive 950, such as a film adhesive, and with the locking paddle 304 facing away from the package carrier 948.

A second device 952, such as a discrete passive component, can mount over the locking terminals 110. In this example, the integrated circuit package system 100 is shown with multiple rows of the locking terminals 110 instead of a single row of the locking terminals 110 as shown in FIG. 1.

A third device 960, such as an integrated circuit die, can mount over the locking paddle 104 with a mounting adhesive 962, such as a die-attach adhesive. First internal interconnects 964, such as bond wires or ribbon bond wires, can connect the third device 960 and the package carrier 948. Second internal interconnects 966, such as bond wires or ribbon bond wires, can connect the integrated circuit package system 100 with the package carrier 948.

The outer encapsulation 844 can be formed over the package carrier 948 covering the first device 946, the integrated circuit package system 100, the second device 952, the third device 960, the first internal interconnects 964, and the second internal interconnects 966. The locking terminals 110 and the locking paddle 104 can also function as mold interlocks for the outer encapsulation 844.

It has been discovered that the present invention provides an integrated circuit package system with locking terminals and locking paddle that can function as mold interlocks for the outer encapsulation in a package-in-package application. This improves MSL performance resulting in improved reliability.

Figure 10:
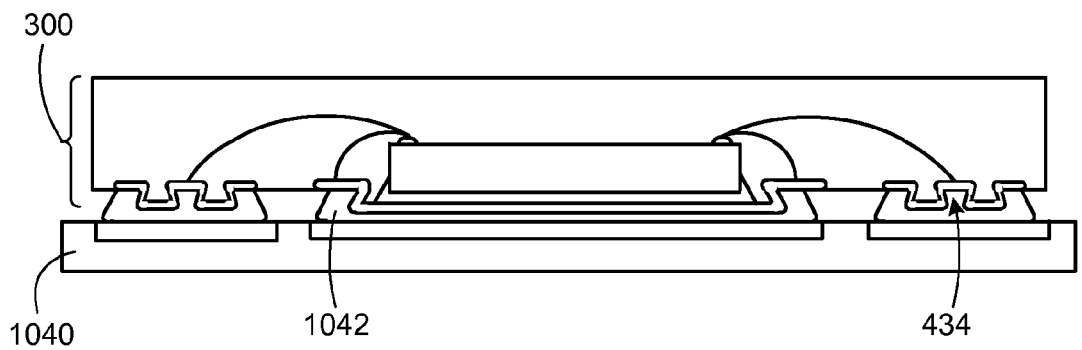
FIG. 10 is a cross-sectional view of an application of the integrated circuit package system of FIG. 4.

Referring now to FIG. 10, therein is shown a cross-sectional view of an application of the integrated circuit package system 300 of FIG. 4. The integrated circuit package system 300 is shown mounted over a subsystem carrier 1040, such as a laminated substrate. An attachment structure 1042, such as a solder joint, can connect and attach the integrated circuit package system 300 with the subsystem carrier 1040. The attachment structure 1042 can fill the terminal cavity 434.

Figure 11:
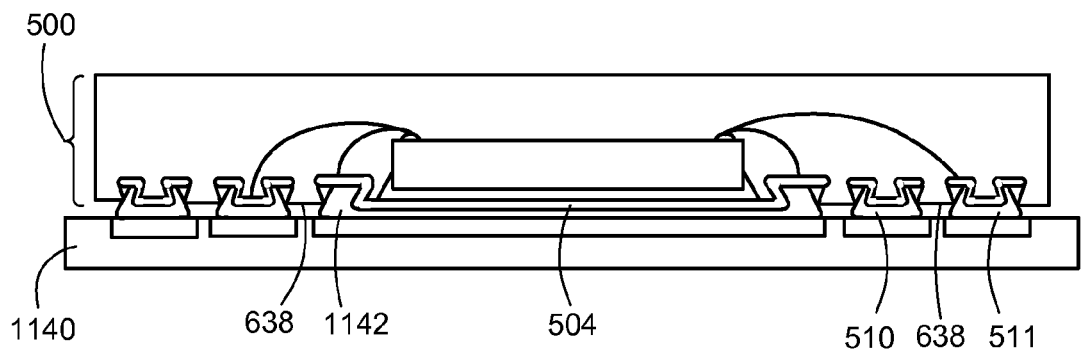
FIG. 11 is a cross-sectional view of an application of the integrated circuit package system of FIG. 6.

Referring now to FIG. 11, therein is shown a cross-sectional view of an application of the integrated circuit package system 500 of FIG. 6. The integrated circuit package system 500 is shown mounted over a subsystem carrier 1140, such as a laminated substrate. An attachment structure 1142, such as a solder joint, can connect and attach the integrated circuit package system 500 with the subsystem carrier 1140. The encapsulation protrusions 638 prevent bridging of the attachment structure 1142 between the first locking terminals 510 and the second locking terminals 511 as well as between the first locking terminals 510 and the locking paddle 504.

Figure 12:
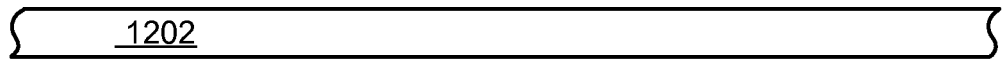
FIG. 12 is a cross-sectional view of a manufacturing carrier.

Referring now to FIG. 12, therein is shown a cross-sectional view of a manufacturing carrier 1202. The manufacturing carrier 1202 can be formed from a number of materials, such as copper. The manufacturing carrier 1202 can serve as a support member or a plating current path that can be used in electroplating process.

Figure 13:
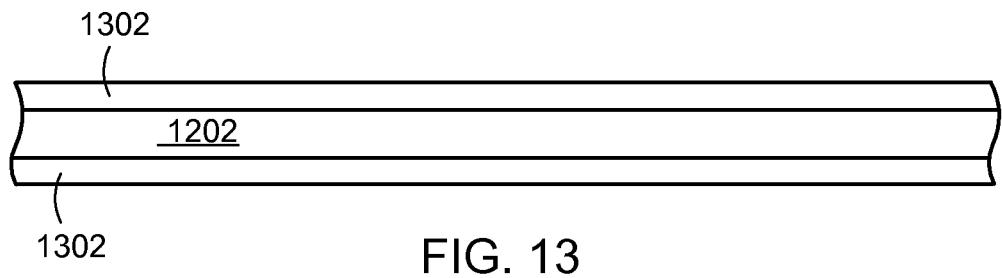
FIG. 13 is the structure of FIG. 12 in applying a first masking layer.

Referring now to FIG. 13, therein is shown the structure of FIG. 12 in applying a first masking layer 1302. The first masking layer 1302, such as a layer of photoresist, can be formed above and below the manufacturing carrier 1202.

Figure 14:
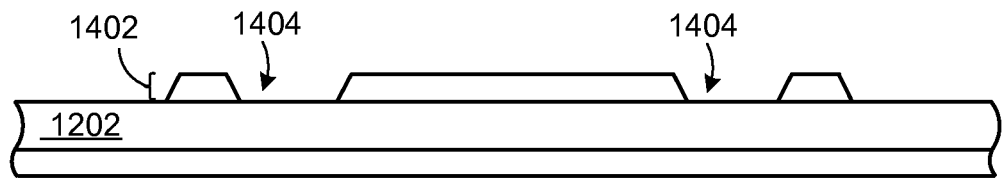
FIG. 14 is the structure of FIG. 13 in forming a first mask.

Referring now to FIG. 14, therein is shown the structure of FIG. 13 in forming a first mask 1402. The first masking layer 1302 of FIG. 13 can undergo a patterning process, such as a photolithographic process with ultra violet (UV) exposure and development, to form first openings 1404 in the first mask 1402 and to form selective plating areas, as an example. Each of the first openings 1404 includes a top portion that is wider than a bottom portion.

Figure 15:
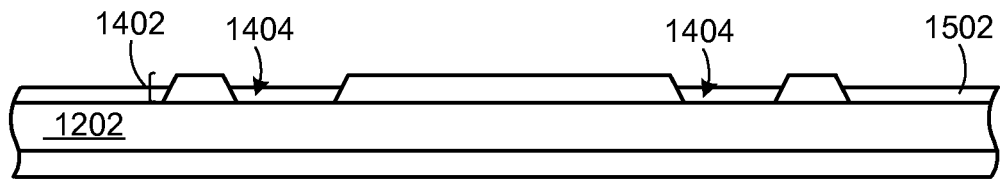
FIG. 15 is the structure of FIG. 14 in applying a second masking layer.

Referring now to FIG. 15, therein is shown the structure of FIG. 14 in applying a second masking layer 1502. The second masking layer 1502 can be formed within the first openings 1404 of the first mask 1402 and over the manufacturing carrier 1202. The second masking layer 1502 can be formed with a number of materials and can preferably be the same material as the manufacturing carrier 1202. The second masking layer 1502 can be deposited by a number of processes, such as by electroplating process.

Figure 16:
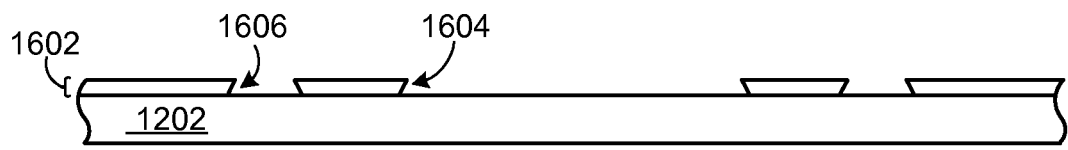
FIG. 16 is the structure of FIG. 15 in forming a second mask.

Referring now to FIG. 16, therein is shown the structure of FIG. 15 in forming a second mask 1602. The first mask 1402 of FIG. 15 undergoes a removal process, such as a strip off the photoresist, leaving the second mask 1602 over the manufacturing carrier 1202. The second mask 1602 includes a central mask recess 1604 between peripheral mask recesses 1606. The central mask recess 1604 includes a top portion narrower than a bottom portion. Also, each of the peripheral mask recesses 1606 includes a top portion narrower than the bottom portion.

Figure 17:
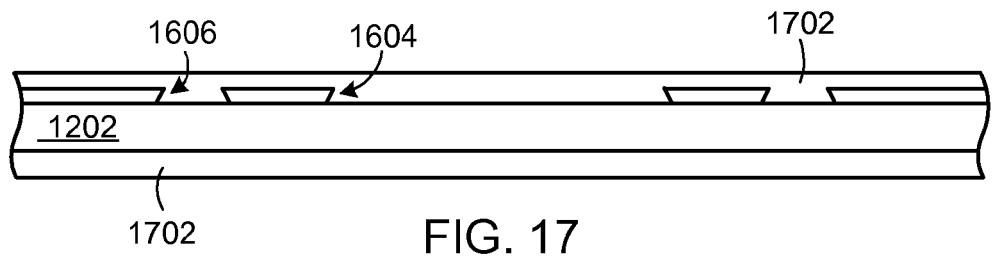
FIG. 17 is the structure of FIG. 16 in forming a third masking layer.

Referring now to FIG. 17, therein is shown the structure of FIG. 16 in forming a third masking layer 1702. The third masking layer 1702, such as a layer of photoresist, can be formed below the manufacturing carrier 1202 and over the second mask 1602 filling the central mask recess 1604 and the peripheral mask recesses 1606.

Figure 18:
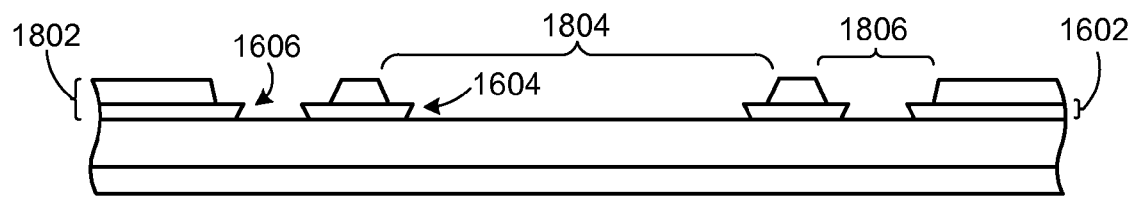
FIG. 18 is the structure of FIG. 17 in forming a third mask.

Referring now to FIG. 18, therein is shown the structure of FIG. 17 in forming a third mask 1802. The third masking layer 1702 of FIG. 17 can undergo a patterning process, such as a photolithographic process with UV exposure and development, to form the third mask 1802 and can define selective plating area, for example. The third mask 1802 include a central opening 1804 between peripheral openings 1806. The central opening 1804 exposes the central mask recess 1604 and a portion of the second mask 1602 adjacent to the central mask recess 1604. The peripheral openings 1806 exposes the peripheral mask recesses 1606 and a portion of the second mask 1602 adjacent to the peripheral mask recesses 1606.

Figure 19:
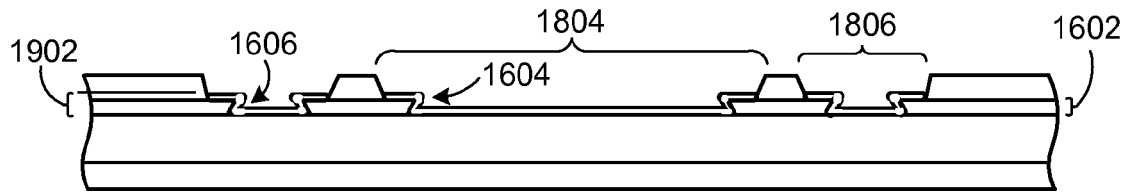
FIG. 19 is the structure of FIG. 18 in forming a conductive layer.

Referring now to FIG. 19, therein is shown the structure of FIG. 18 in forming a conductive layer 1902. The conductive layer 1902 can be formed by a number of processes. For example, the conductive layer 1902 can be formed by electroplating process with Au, Pd, Ni, or a combination thereof. The conductive layer 1902 can be formed in the central opening 1804 over the exposed portion of the second mask 1602 and formed conformally in the central mask recess 1604. The conductive layer 1902 can also be formed in the peripheral openings 1806 over the exposed portion of the second mask 1602 and formed conformally in the peripheral mask recesses 1606.

Figure 20:
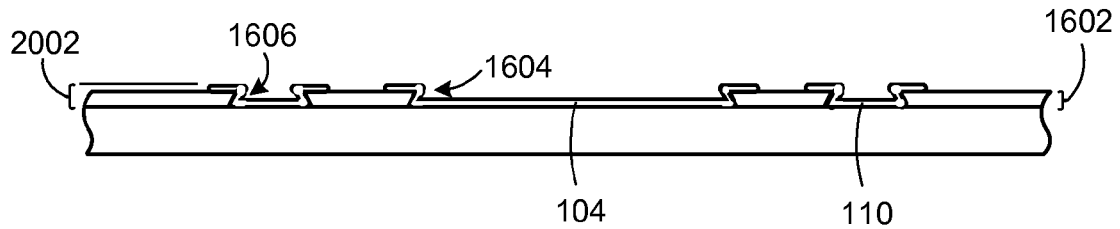
FIG. 20 is the structure of FIG. 19 in forming a conductive mask.

Referring now to FIG. 20, therein is shown the structure of FIG. 19 in forming a conductive mask 2002. The third mask 1802 of FIG. 19 can undergo a removal process, such as a strip off the photoresist leaving the conductive mask 2002 and the second mask 1602 exposed by the conductive mask 2002. A portion of the conductive mask 2002 in and adjacent to the central mask recess 1604 is the locking paddle 104. Another portion of the conductive mask 2002 in and adjacent to the peripheral mask recesses 1606 is the locking terminals 110.

It has been discovered that the present invention provide the integrated circuit package system 100 with better terminal coplanarity control as the plated metal layers can be formed on the flat surface of the manufacturing carrier thereby mitigating or eliminating removal, such as half etching, process tolerance that causes non-coplanarity. The improved coplanarity increases the maximum height of the locking terminals by three times.

Figure 21:
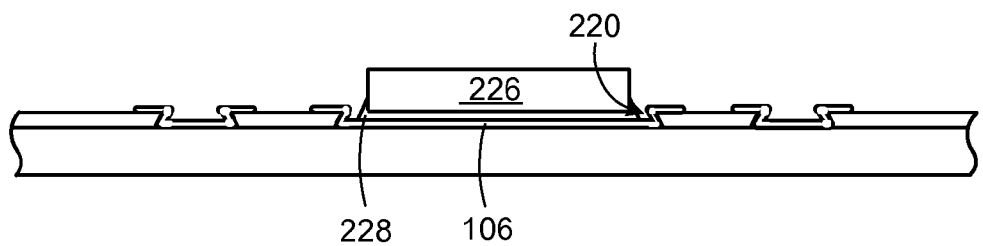
FIG. 21 is the structure of FIG. 20 in mounting the integrated circuit.

Referring now to FIG. 21, therein is shown the structure of FIG. 20 in mounting the integrated circuit 226. The integrated circuit 226 mounts over the paddle base 106 with the first adhesive 228 and in the paddle recess 220.

Figure 22:
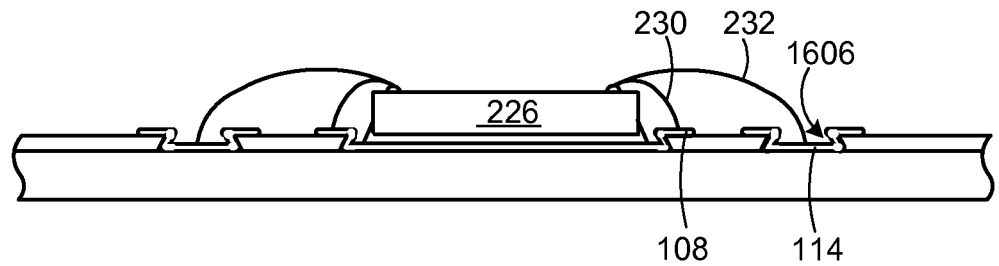
FIG. 22 is the structure of FIG. 21 in connecting the integrated circuit.

Referring now to FIG. 22, therein is shown the structure of FIG. 21 in connecting the integrated circuit 226. The first interconnects 230 can connect the integrated circuit 226 and the paddle rim 108. The second interconnects 232 can connect the integrated circuit 226 and the terminal base 114 in the terminal recess 224.

Figure 23:
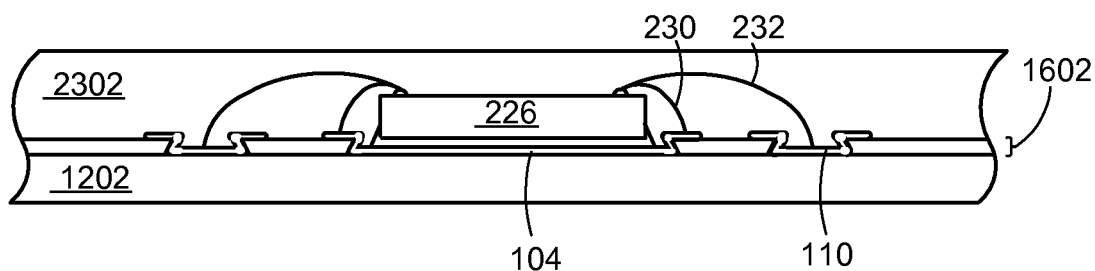
FIG. 23 is the structure of FIG. 22 in forming an intermediate encapsulation.

Referring now to FIG. 23, therein is shown the structure of FIG. 22 in forming an intermediate encapsulation 2302. The intermediate encapsulation 2302, such as a cover of an epoxy molding compound, can be formed over the integrated circuit 226, the first interconnects 230, the second interconnects 232, the second mask 1602, the locking paddle 104, and the locking terminals 110. The intermediate encapsulation 2302 is formed over the manufacturing carrier 1202.

Figure 24:
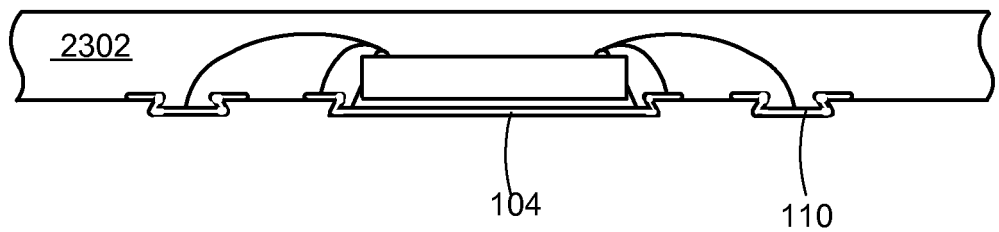
FIG. 24 is the structure of FIG. 23 in exposing the locking terminals and the locking paddle.

Referring now to FIG. 24, therein is shown the structure of FIG. 23 in exposing the locking terminals 110 and the locking paddle 104. The manufacturing carrier 1202 of FIG. 23 can undergo a removal process, such as an etching process, to expose the locking terminals 110, the locking paddle 104, and the intermediate encapsulation 2302.

Figure 25:
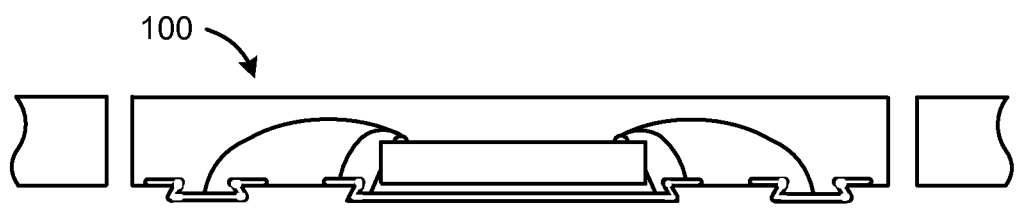
FIG. 25 is the structure of FIG. 24 in singulating the integrated circuit package system of FIG. 2.

Referring now to FIG. 25, therein is shown the structure of FIG. 24 in singulating the integrated circuit package system 100 of FIG. 2. The structure of FIG. 24 can undergo a singulating process, such as sawing or punching, forming the integrated circuit package system 100.

Figure 26:
FIG. 26 is a cross-sectional view of a manufacturing carrier.

Referring now to FIG. 26, therein is shown a cross-sectional view of a manufacturing carrier 2602. The manufacturing carrier 2602 can be formed from a number of materials, such as copper. The manufacturing carrier 2602 can serve as a support member or a plating current path that can be used in electroplating process.

Figure 27:
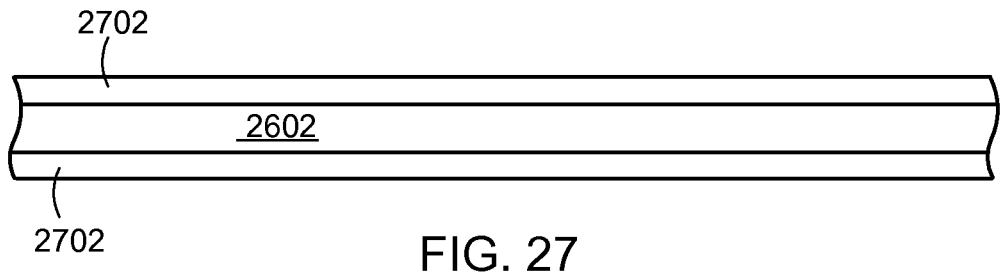
FIG. 27 is the structure of FIG. 26 in applying a first masking layer.

Referring now to FIG. 27, therein is shown the structure of FIG. 26 in applying a first masking layer 2702. The first masking layer 2702, such as a layer of photoresist, can be formed above and below the manufacturing carrier 2602.

Figure 28:
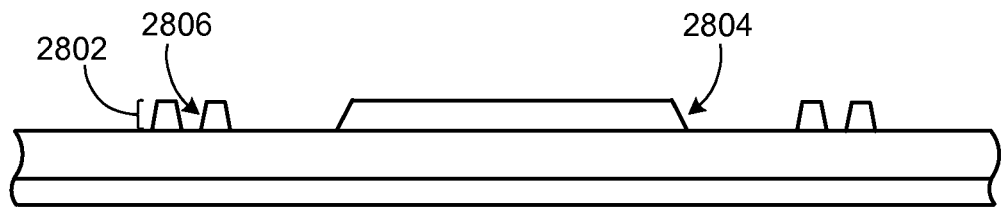
FIG. 28 is the structure of FIG. 27 in forming a first mask.

Referring now to FIG. 28, therein is shown the structure of FIG. 27 in forming a first mask 2802. The first masking layer 2702 of FIG. 27 can undergo a patterning process, such as a photolithographic process with ultra violet (UV) exposure and development, to form first openings 2804 and second openings 2806 in the first mask 2802 and to form selective plating areas, as an example. Adjacent locations of the first openings 2804 and the second openings 2806 can be a single opening in the first mask 2802 but is depicted as separate openings in the cross-sectional view. The first openings 2804 are adjacent to the larger protrusion of the first mask 2802 and the second openings 2806 are between the smaller protrusions of the first mask 2802. Each of the first openings 2804 and each of the second openings 2806 include a top portion that is wider than a bottom portion.

Figure 29:
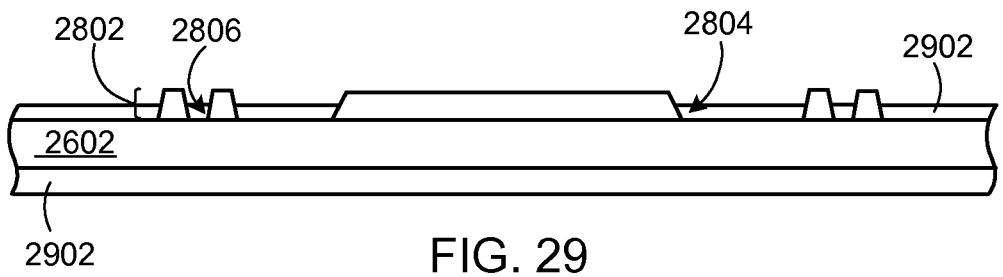
FIG. 29 is the structure of FIG. 28 in applying a second masking layer.

Referring now to FIG. 29, therein is shown the structure of FIG. 28 in applying a second masking layer 2902. The second masking layer 2902 can be formed within the first openings 2804 and the second openings 2806 of the first mask 2802 and over the manufacturing carrier 2602. The second masking layer 2902 can be formed with a number of materials and can preferably be the same material as the manufacturing carrier 2602. The second masking layer 2902 can be deposited by a number of processes, such as by electroplating process.

Figure 30:
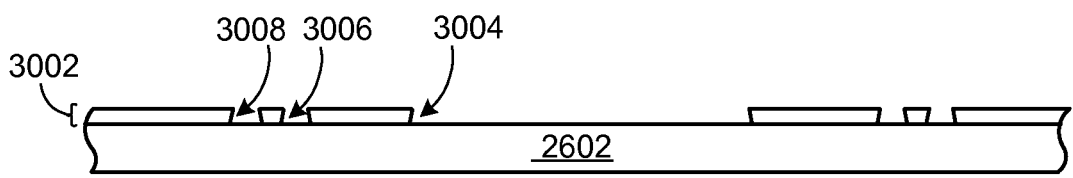
FIG. 30 is the structure of FIG. 29 in forming a second mask.

Referring now to FIG. 30, therein is shown the structure of FIG. 29 in forming a second mask 3002. The first mask 2802 of FIG. 29 undergoes a removal process, such as a strip off the photoresist, leaving the second mask 3002 over the manufacturing carrier 2602. The second mask 3002 includes a central mask recess 3004 between first peripheral mask recesses 3006. The second mask 3002 also includes second peripheral mask recesses 3008 with the first peripheral mask recesses 3006 between the central mask recess 3004 and the second peripheral mask recesses 3008. Adjacent locations of the first peripheral mask recesses 3006 and the second peripheral mask recesses 3008 can be a single peripheral mask recesses in the second mask 3002 but is depicted as separate openings in the cross-sectional view. The central mask recess 3004 includes a top portion narrower than a bottom portion. Each of the first peripheral mask recesses 3006 include a top portion narrower than the bottom portion. Each of the second peripheral mask recesses 3008 includes a top portion narrower than the bottom portion.

Figure 31:
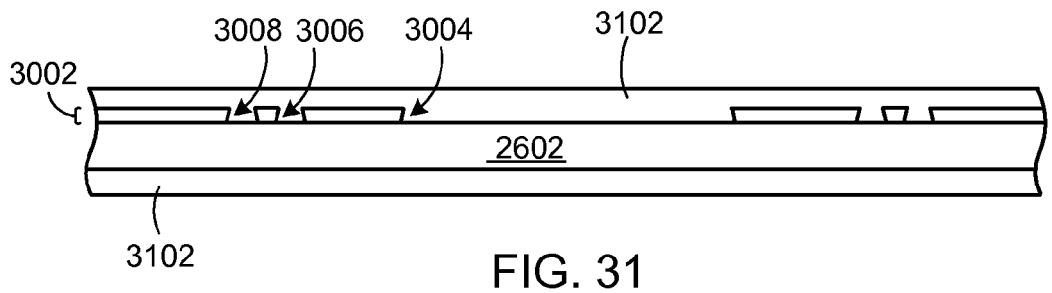
FIG. 31 is the structure of FIG. 30 in forming a third masking layer.

Referring now to FIG. 31, therein is shown the structure of FIG. 30 in forming a third masking layer 3102. The third masking layer 3102, such as a layer of photoresist, can be formed below the manufacturing carrier 2602 and over the second mask 3002 filling the central mask recess 3004, the first peripheral mask recesses 3006, and the second peripheral mask recesses 3008.

Figure 32:
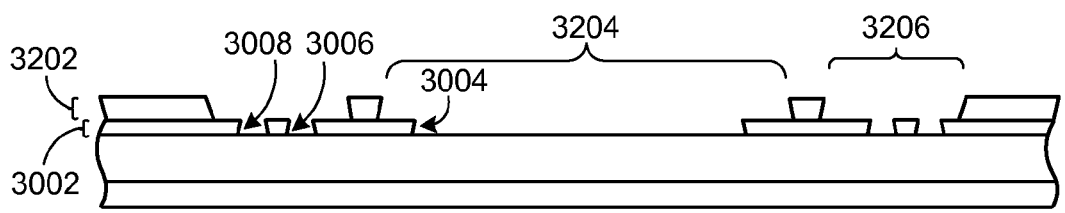
FIG. 32 is the structure of FIG. 31 in forming a third mask.

Referring now to FIG. 32, therein is shown the structure of FIG. 31 in forming a third mask 3202. The third masking layer 3102 of FIG. 31 can undergo a patterning process, such as a photolithographic process with UV exposure and development, to form the third mask 3202 and can define selective plating area, for example. The third mask 3202 include a central opening 3204 between peripheral openings 3206. The central opening 3204 exposes the central mask recess 3004 and a portion of the second mask 3002 adjacent to the central mask recess 3004. The peripheral openings 3206 exposes the first peripheral mask recesses 3006, the second peripheral mask recesses 3008, and a portion of the second mask 3002 adjacent to the first peripheral mask recesses 3006 and adjacent to the second peripheral mask recesses 3008.

Figure 33:
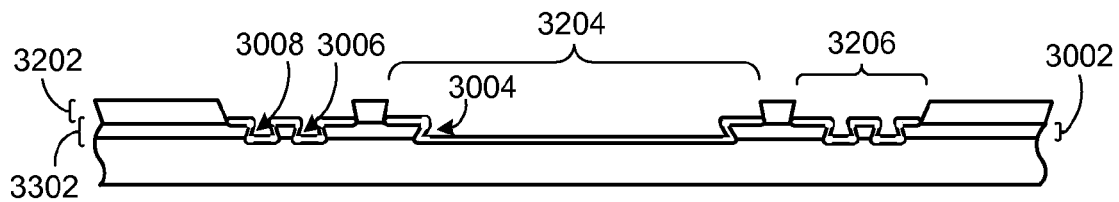
FIG. 33 is the structure of FIG. 32 in forming a conductive layer.

Referring now to FIG. 33, therein is shown the structure of FIG. 32 in forming a conductive layer 3302. The conductive layer 3302 can be formed by a number of processes. For example, the conductive layer 3302 can be formed by electroplating process with Au, Pd, Ni, or a combination thereof. The conductive layer 3302 can be formed in the central opening 3204 over the exposed portion of the second mask 3002 and formed conformally in the central mask recess 3004. The conductive layer 3302 can also be formed in the peripheral openings 3206 over the exposed portion of the second mask 3002 and formed conformally in the first peripheral mask recesses 3006 and the second peripheral mask recesses 3008.

Figure 34:
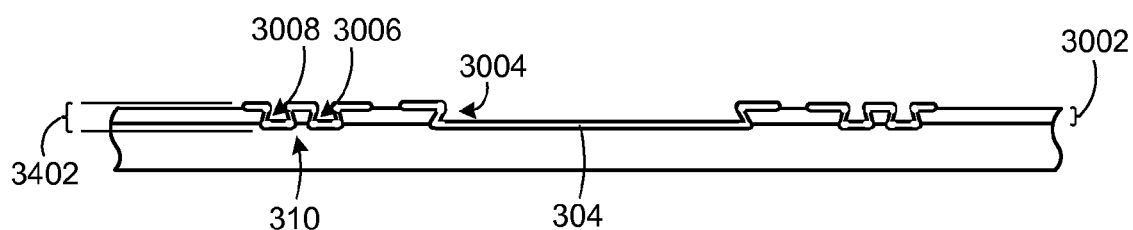
FIG. 34 is the structure of FIG. 33 in forming a conductive mask.

Referring now to FIG. 34, therein is shown the structure of FIG. 33 in forming a conductive mask 3402. The third mask 3202 of FIG. 33 can undergo a removal process, such as a strip off the photoresist leaving the conductive mask 3402 and the second mask 3002 exposed by the conductive mask 3402. A portion of the conductive mask 3402 in and adjacent to the central mask recess 3004 is the locking paddle 304. Another portion of the conductive mask 3402 in and adjacent to the first peripheral mask recesses 3006 and the second peripheral mask recesses 3008 are the locking terminals 310.

Figure 35:
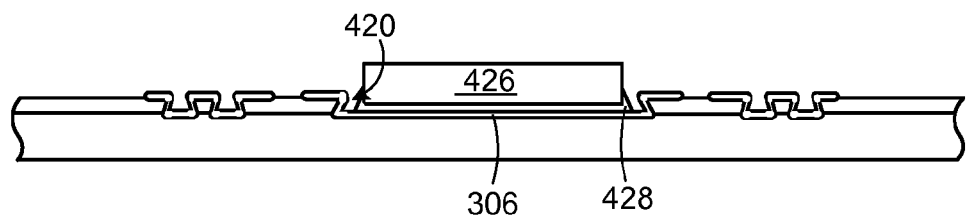
FIG. 35 is the structure of FIG. 34 in mounting the integrated circuit.

Referring now to FIG. 35, therein is shown the structure of FIG. 34 in mounting the integrated circuit 426. The integrated circuit 426 mounts over the paddle base 306 with the first adhesive 428 and in the paddle recess 420.

Figure 36:
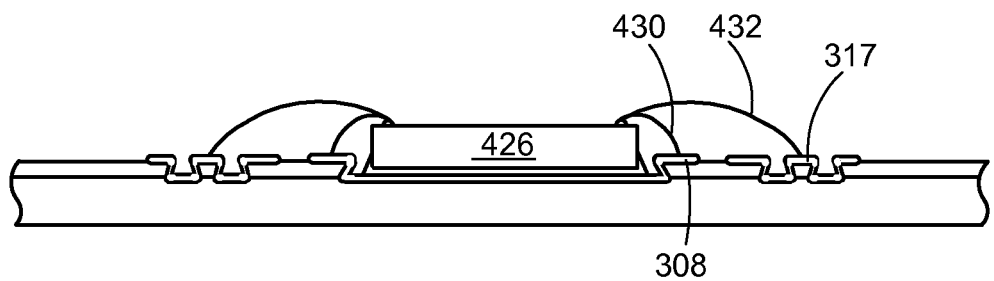
FIG. 36 is the structure of FIG. 35 in connecting the integrated circuit.

Referring now to FIG. 36, therein is shown the structure of FIG. 35 in connecting the integrated circuit 426. The first interconnects 430 can connect the integrated circuit 426 and the paddle rim 308. The second interconnects 432 can connect the integrated circuit 426 and the inner terminal rim 317.

Figure 37:
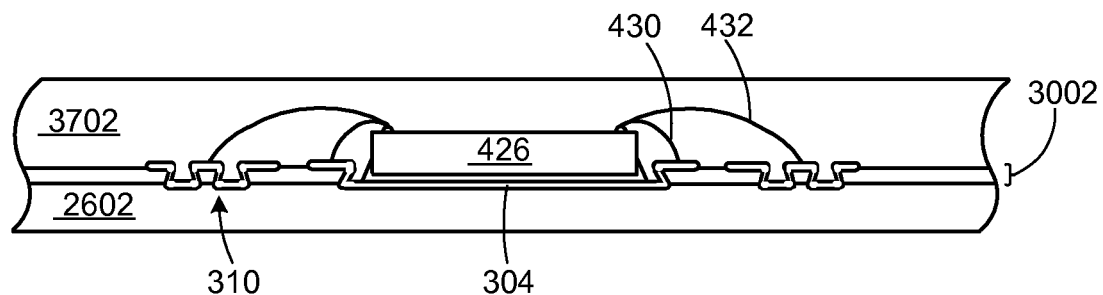
FIG. 37 is the structure of FIG. 36 in forming an intermediate encapsulation.

Referring now to FIG. 37, therein is shown the structure of FIG. 36 in forming an intermediate encapsulation 3702. The intermediate encapsulation 3702, such as a cover of an epoxy molding compound, can be formed over the integrated circuit 426, the first interconnects 430, the second interconnects 432, the second mask 3002, the locking paddle 304, and the locking terminals 310. The intermediate encapsulation 3702 is formed over the manufacturing carrier 2602.

Figure 38:
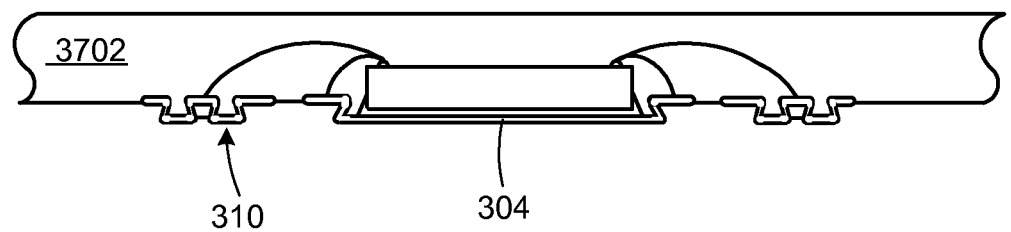
FIG. 38 is the structure of FIG. 37 in exposing the locking terminals and the locking paddle.

Referring now to FIG. 38, therein is shown the structure of FIG. 37 in exposing the locking terminals 310 and the locking paddle 304. The manufacturing carrier 2602 of FIG. 37 can undergo a removal process, such as an etching process, to expose the locking terminals 310, the locking paddle 304, and the intermediate encapsulation 3702.

Figure 39:
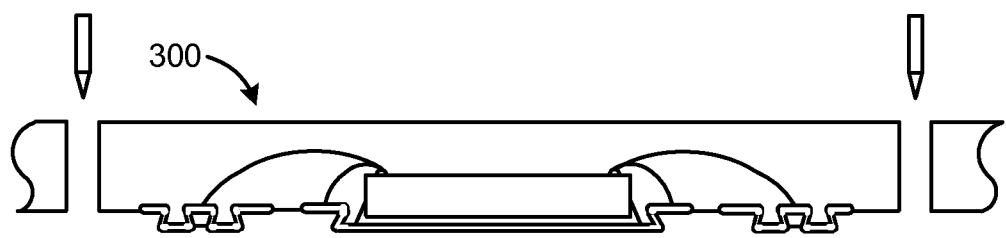
FIG. 39 is the structure of FIG. 38 in singulating the integrated circuit package system of FIG. 4.

Referring now to FIG. 39, therein is shown the structure of FIG. 38 in singulating the integrated circuit package system 300 of FIG. 4. The structure of FIG. 38 can undergo a singulating process, such as sawing or punching, forming the integrated circuit package system 300.

Figure 40:
FIG. 40 is a cross-sectional view of a manufacturing carrier.

Referring now to FIG. 40, therein is shown a cross-sectional view of a manufacturing carrier 4002. The manufacturing carrier 4002 can be formed from a number of materials, such as copper. The manufacturing carrier 4002 can serve as a support member or a plating current path that can be used in electroplating process.

Figure 41:
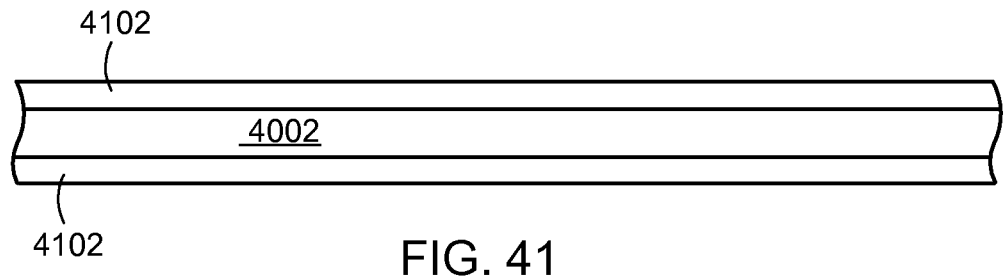
FIG. 41 is the structure of FIG. 40 in applying a first masking layer.

Referring now to FIG. 41, therein is shown the structure of FIG. 40 in applying a first masking layer 4102. The first masking layer 4102, such as a layer of photoresist, can be formed above and below the manufacturing carrier 4002.

Figure 42:
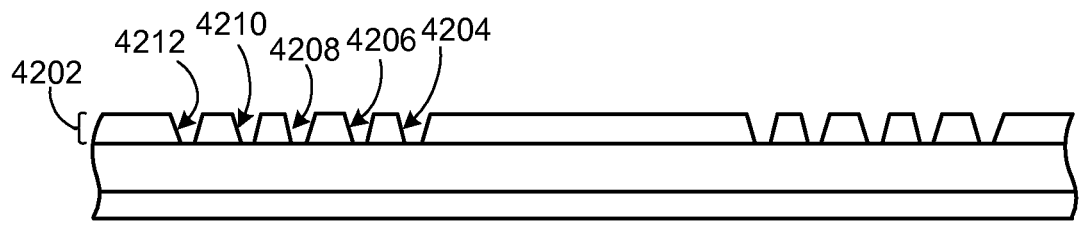
FIG. 42 is the structure of FIG. 41 in forming a first mask.

Referring now to FIG. 42, therein is shown the structure of FIG. 41 in forming a first mask 4202. The first masking layer 4102 of FIG. 41 can undergo a patterning process, such as a photolithographic process with ultra violet (UV) exposure and development, to form first openings 4204, second openings 4206, third openings 4208, fourth openings 4210, and fifth openings 4212 in the in the first mask 4202 and to form selective plating areas, as an example. The first openings 4204 are adjacent to the larger protrusion of the first mask 4202 and the second openings 4206 are between the third openings and the first openings 4204. The fourth openings 4210 are between the fifth openings 4212 and the third openings 4208. Each of the first openings 4204, the second openings 4206, the third openings 4208, the fourth openings 4210, and the fifth openings 4212 include a top portion that is wider than a bottom portion.

Figure 43:
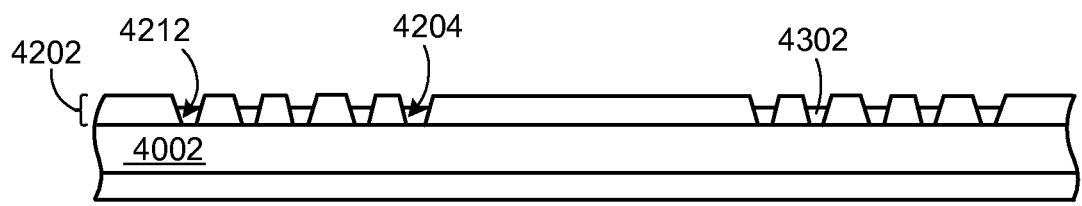
FIG. 43 is the structure of FIG. 42 in applying a second masking layer.

Referring now to FIG. 43, therein is shown the structure of FIG. 42 in applying a second masking layer 4302. The second masking layer 4302 can be formed within the first openings 4204 through the fifth openings 4212 of the first mask 4202 and over the manufacturing carrier 4002. The second masking layer 4302 can be formed with a number of materials and can preferably be the same material as the manufacturing carrier 4002. The second masking layer 4302 can be deposited by a number of processes, such as by electroplating process.

Figure 44:
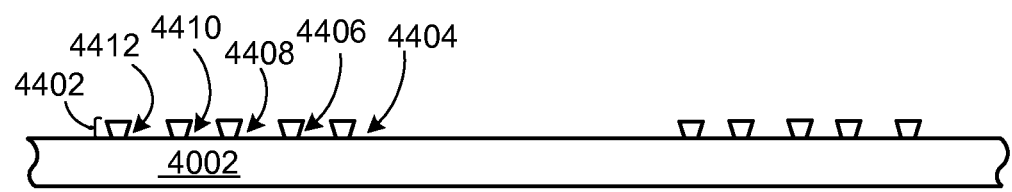
FIG. 44 is the structure of FIG. 43 in forming a second mask.

Referring now to FIG. 44, therein is shown the structure of FIG. 43 in forming a second mask 4402. The first mask 4202 of FIG. 43 undergoes a removal process, such as a strip off the photoresist, leaving the second mask 4402 over the manufacturing carrier 4002. The second mask 4402 includes a central mask recess 4404 between first peripheral mask recesses 4406. The second mask 4402 also includes second peripheral mask recesses 4408 with the first peripheral mask recesses 4406 between the central mask recess 4404 and the second peripheral mask recesses 4408. The second mask 4402 further includes third peripheral mask recesses 4410 between the second peripheral mask recesses 4408 and fourth peripheral mask recesses 4412.

The central mask recess 4404 includes a top portion narrower than a bottom portion. Each of the first peripheral mask recesses 4406 through the fourth peripheral mask recesses 4412 include a top portion narrower than the bottom portion.

Figure 45:
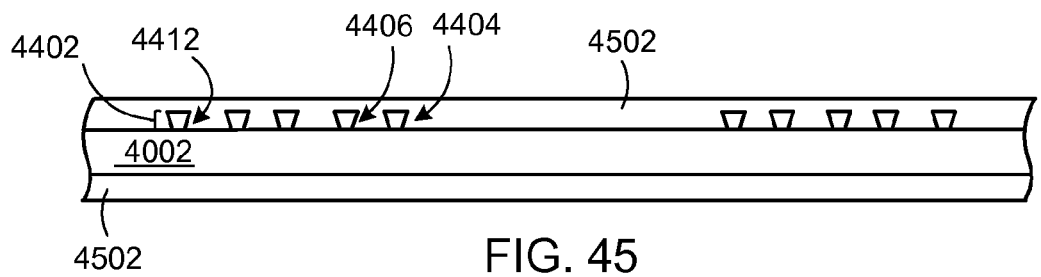
FIG. 45 is the structure of FIG. 44 in forming a third masking layer.

Referring now to FIG. 45, therein is shown the structure of FIG. 44 in forming a third masking layer 4502. The third masking layer 4502, such as a layer of photoresist, can be formed below the manufacturing carrier 4002 and over the second mask 4402 filling the central mask recess 4404, and the first peripheral mask recesses 4406 through the fourth peripheral mask recesses 4412.

Figure 46:
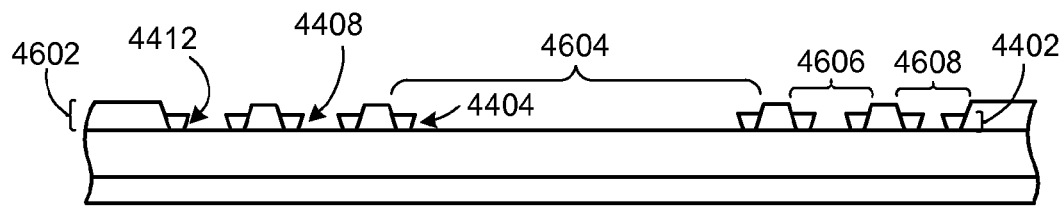
FIG. 46 is the structure of FIG. 45 in forming a third mask.

Referring now to FIG. 46, therein is shown the structure of FIG. 45 in forming a third mask 4602. The third masking layer 4502 of FIG. 45 can undergo a patterning process, such as a photolithographic process with UV exposure and development, to form the third mask 4602 and can define selective plating area, for example. The third mask 4602 include a central opening 4604 between first peripheral openings 4606. The third mask 4602 also include second peripheral openings 4608 adjacent to the first peripheral openings 4606 at the opposite of the central opening 4604. The central opening 4604 exposes the central mask recess 4404 and a portion of the second mask 4402 adjacent to the central mask recess 4404. The first peripheral openings 4606 expose the second peripheral mask recesses 4408 and a portion of the second mask 4402 adjacent to the second peripheral mask recesses 4408. The second peripheral openings 4608 expose the fourth peripheral mask recesses 4412 and a portion of the second mask 4402 adjacent to the fourth peripheral mask recesses 4412.

Figure 47:
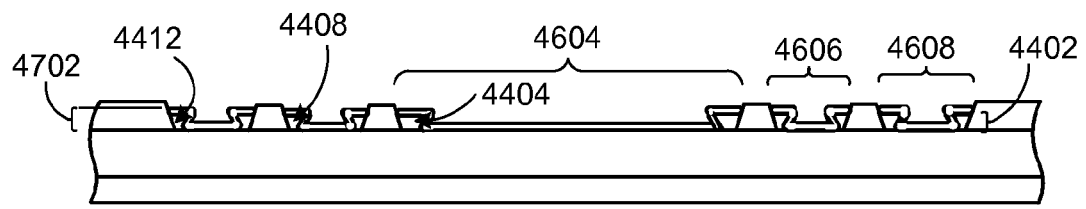
FIG. 47 is the structure of FIG. 46 in forming a conductive layer.

Referring now to FIG. 47, therein is shown the structure of FIG. 46 in forming a conductive layer 4702. The conductive layer 4702 can be formed by a number of processes. For example, the conductive layer 4702 can be formed by electroplating process with Au, Pd, Ni, or a combination thereof. The conductive layer 4702 can be formed in the central opening 4604 over the exposed portion of the second mask 4402 and formed conformally in the central mask recess 4404. The conductive layer 4702 can also be formed in the first peripheral openings 4606 over the exposed portion of the second mask 4402 and formed conformally in the second peripheral mask recesses 4408. The conductive layer 4702 can further be formed in the second peripheral openings 4608 over the exposed portion of the second mask 4402 and formed conformally in the fourth peripheral mask recesses 4412.

Figure 48:
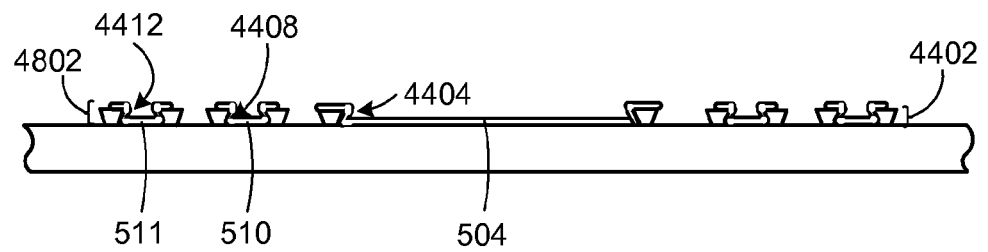
FIG. 48 is the structure of FIG. 47 in forming a conductive mask.

Referring now to FIG. 48, therein is shown the structure of FIG. 47 in forming a conductive mask 4802. The third mask 4602 of FIG. 47 can undergo a removal process, such as a strip off the photoresist leaving the conductive mask 4802 and the second mask 4402 under the conductive mask 4802. A portion of the conductive mask 4802 in and adjacent to the central mask recess 4404 is the locking paddle 504. Another portion of the conductive mask 4802 in and adjacent to the second peripheral mask recesses 4408 is the first locking terminals 510. A further portion of the conductive mask 4802 in and adjacent to the fourth peripheral mask recesses 4412 is the second locking terminals 511.

Figure 49:
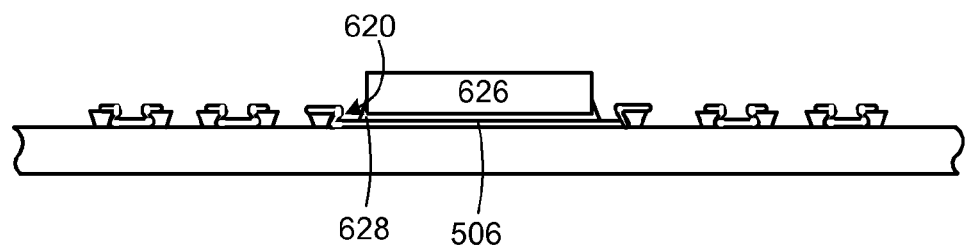
FIG. 49 is the structure of FIG. 48 in mounting the integrated circuit.

Referring now to FIG. 49, therein is shown the structure of FIG. 48 in mounting the integrated circuit 626. The integrated circuit 626 mounts over the paddle base 506 with the first adhesive 628 and in the paddle recess 620.

Figure 50:
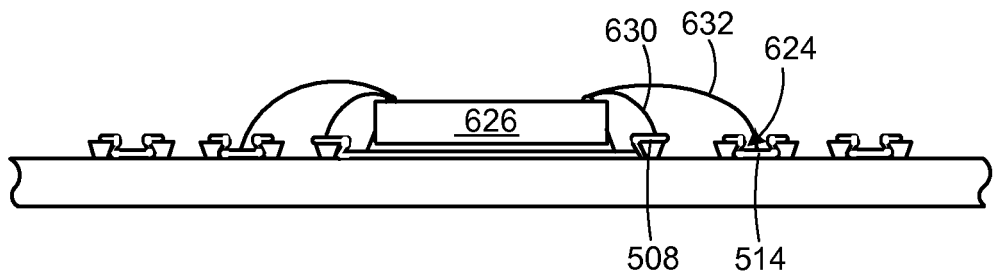
FIG. 50 is the structure of FIG. 49 in connecting the integrated circuit.

Referring now to FIG. 50, therein is shown the structure of FIG. 49 in connecting the integrated circuit 626. The first interconnects 630 can connect the integrated circuit 626 and the paddle rim 508. The second interconnects 632 can connect the integrated circuit 626 and the first terminal base 514 in the first terminal recess 624.

Figure 51:
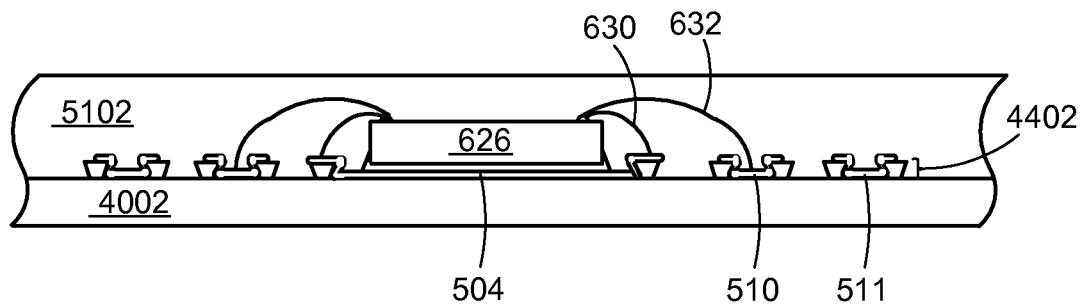
FIG. 51 is the structure of FIG. 50 in forming an intermediate encapsulation.

Referring now to FIG. 51, therein is shown the structure of FIG. 50 in forming an intermediate encapsulation 5102. The intermediate encapsulation 5102, such as a cover of an epoxy molding compound, can be formed over the integrated circuit 626, the first interconnects 630, the second interconnects 632, the second mask 4402, the locking paddle 504, the first locking terminals 510, and the second locking terminals 511. The intermediate encapsulation 5102 is formed over the manufacturing carrier 4002.

Figure 52:
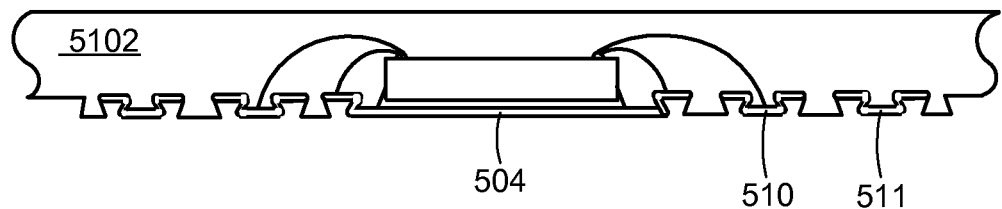
FIG. 52 is the structure of FIG. 51 in exposing the first locking terminals, the second locking terminals, and the locking paddle.

Referring now to FIG. 52, therein is shown the structure of FIG. 51 in exposing the first locking terminals 510, the second locking terminals 511, and the locking paddle 504. The manufacturing carrier 4002 of FIG. 51 can undergo a removal process, such as an etching process, to expose the first locking terminals 510, the second locking terminals 511, the locking paddle 504, and the intermediate encapsulation 5102.

Figure 53:
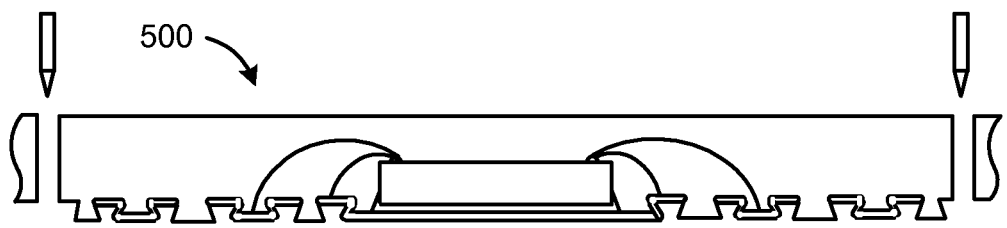
FIG. 53 is the structure of FIG. 52 in singulating the integrated circuit package system of FIG. 6.

Referring now to FIG. 53, therein is shown the structure of FIG. 52 in singulating the integrated circuit package system 500 of FIG. 6. The structure of FIG. 52 can undergo a singulating process, such as sawing or punching, forming the integrated circuit package system 500.

Figure 54:
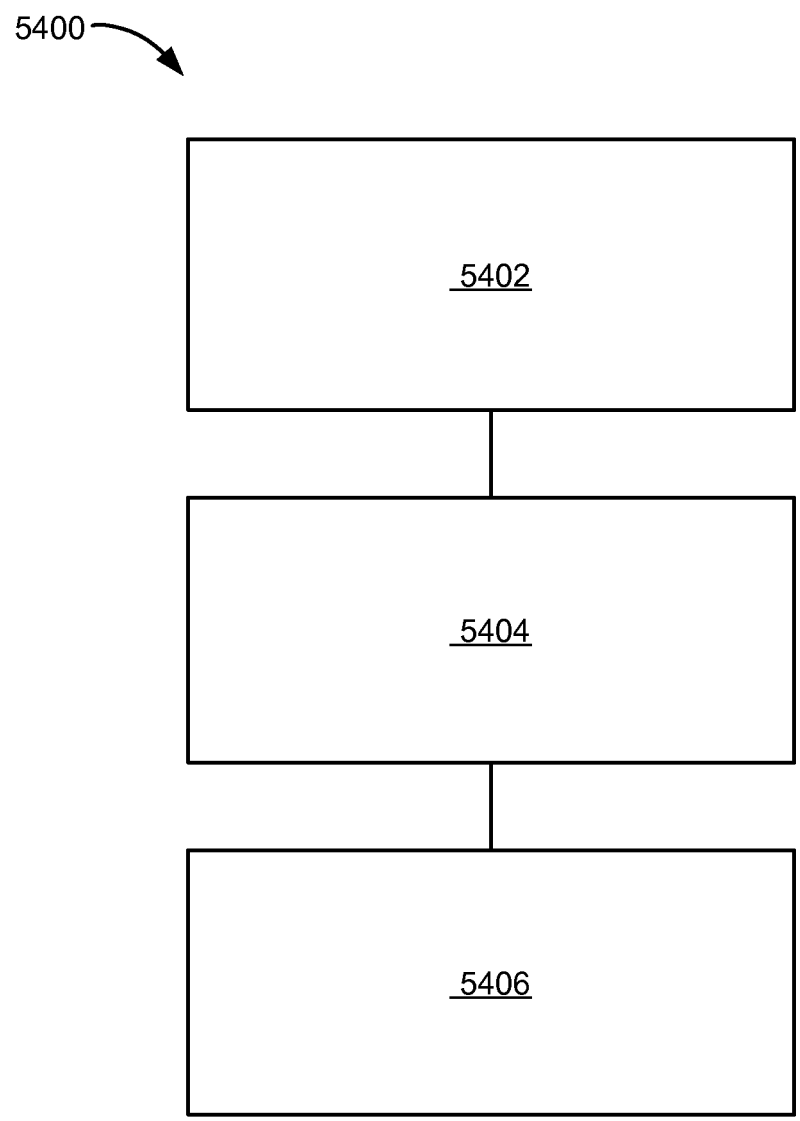
FIG. 54 is a flow chart of an integrated circuit package system for manufacture of the integrated circuit package system in an embodiment of the present invention.

Referring now to FIG. 54, therein is shown a flow chart of an integrated circuit package system 5400 for manufacture of the integrated circuit package system 100 in an embodiment of the present invention. The system 5400 includes forming a first locking terminal having a first terminal recess with a top portion of the first terminal recess narrower than a bottom portion of the first terminal recess in a block 5402; connecting an integrated circuit and the first locking terminal in a block 5404; and forming a package encapsulation over the integrated circuit and in the first locking terminal in a block 5406.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    forming a first locking terminal having a first terminal base, a first terminal wall around the first terminal base, and a first terminal rim extending outward completely around the first terminal wall, with the first terminal wall extending upward from the first terminal base, the first locking terminal having a first terminal recess defined by the first terminal base and the first terminal wall slanted inward wherein a top opening of the first terminal recess is narrower than a bottom of the first terminal recess;
    forming a second locking terminal having a second terminal base, a second terminal wall, and a second terminal rim, with the bottom side of the second terminal base co-planar with the bottom side of the first terminal base;
    connecting an integrated circuit and the first locking terminal; and
    forming a package encapsulation over the integrated circuit and the first locking terminal, the package encapsulation having a package perimeter completely surrounding the first locking terminal, the bottom side of the first terminal base exposed from the package encapsulation, and the first terminal rim exposed from the package encapsulation.

2. The method as claimed in claim 1 wherein forming the first locking terminal having the first terminal recess includes forming the first terminal wall having a non-vertical angle between a first terminal base and a first terminal rim.

3. The method as claimed in claim 1 wherein forming the package encapsulation includes forming an encapsulation protrusion between the first locking terminal and the second locking terminal.

4. The method as claimed in claim 1 further comprising:
    forming a locking paddle having a paddle recess;
    mounting the integrated circuit over the locking paddle;
    wherein forming the package encapsulation includes:
    forming the package encapsulation in the paddle recess.

5. The method as claimed in claim 1 wherein forming the first locking terminal having the first terminal recess includes:
    forming an outer terminal wall between the first terminal base and an outer terminal rim; and
    forming an inner terminal wall between the first terminal base and an inner terminal rim.

6. A method for manufacturing an integrated circuit package system comprising:
  forming a first locking terminal having a first terminal base, a first terminal wall around the first terminal base, and a first terminal rim extending outward completely around the first terminal wall, with the first terminal wall extending upward from the first terminal base, the first locking terminal having a first terminal recess defined by the first terminal base and the first terminal wall slanted inward wherein a top opening of the first terminal recess is narrower than a bottom of the first terminal recess;
  forming a second locking terminal having a second terminal base, a second terminal wall, and a second terminal rim, with the bottom side of the second terminal base co-planar with the bottom side of the first terminal base;
  forming a locking paddle having a paddle recess with a top of the paddle recess narrower than a bottom of the paddle recess;
  mounting an integrated circuit over the locking paddle and in the paddle recess;
  connecting the integrated circuit and the first locking terminal; and
  forming a package encapsulation over the integrated circuit and in the first locking terminal and the locking paddle, the package encapsulation having a package perimeter completely surrounding the first locking terminal and the second locking terminal, the bottom side of the first terminal base exposed from the package encapsulation, and the first terminal rim exposed from the package encapsulation.

7. The method as claimed in claim 6 further comprising:
  mounting a device over the first locking terminal; and
  forming an outer encapsulation over the device and the package encapsulation.

8. The method as claimed in claim 6 further comprising connecting the integrated circuit and a paddle rim of the locking paddle.

9. The method as claimed in claim 6 wherein connecting the integrated circuit and the first locking terminal includes connecting the first locking terminal inside the first terminal recess.

10. The method as claimed in claim 6 wherein forming the first locking terminal includes forming the first locking terminal co-planar with the locking paddle.

11. An integrated circuit package system comprising:
  a first locking terminal having a first terminal base, a first terminal wall around the first terminal base, and a first terminal rim extending outward completely around the first terminal wall, with the first terminal wall extending upward from the first terminal base, the first locking terminal having a first terminal recess defined by the first terminal base and the first terminal wall slanted inward wherein a top opening of the first terminal recess is narrower than a bottom of the first terminal recess;
  a second locking terminal having a second terminal base, a second terminal wall, and a second terminal rim, with the bottom side of the second terminal base co-planar with the bottom side of the first terminal base;
  an integrated circuit connected with the first locking terminal; and
  a package encapsulation over the integrated circuit, the first locking terminal, and the second locking terminal, with the package encapsulation having a package perimeter completely surrounding the first locking terminal, the bottom side of the first terminal base exposed from the package encapsulation, and the first terminal rim exposed from the package encapsulation.

12. The system as claimed in claim 11 wherein the first locking terminal includes the first terminal wall having a non-vertical angle between a first terminal base and a first terminal rim.

13. The system as claimed in claim 11 wherein the package encapsulation includes an encapsulation protrusion between the first locking terminal and the second locking terminal.

14. The system as claimed in claim 11 further comprising:
  a locking paddle having a paddle recess;
wherein:
  the integrated circuit is over the locking paddle; and
  the package encapsulation is in the paddle recess.

15. The system as claimed in claim 11 wherein the first locking terminal includes:
  an outer terminal wall between the first terminal base and an outer terminal rim; and
  an inner terminal wall between the first terminal base and an inner terminal rim.

16. The system as claimed in claim 11 further comprising:
  a locking paddle having a paddle recess;
wherein:
  the integrated circuit over the locking paddle and in the paddle recess; and
  the package encapsulation in the paddle recess.

17. The system as claimed in claim 16 further comprising:
  a device over the first locking terminal; and
  an outer encapsulation over the device and the package encapsulation.

18. The system as claimed in claim 16 further comprising the integrated circuit connected with a paddle rim of the locking paddle.

19. The system as claimed in claim 16 wherein the integrated circuit connected with the first locking terminal inside the first terminal recess.

20. The system as claimed in claim 16 wherein the first locking terminal is co-planar with the locking paddle.

* * * * *